US009184266B2

(12) United States Patent
Kub

(10) Patent No.: US 9,184,266 B2
(45) Date of Patent: Nov. 10, 2015

(54) TRANSISTOR HAVING GRAPHENE BASE

(71) Applicant: Francis J. Kub, Arnold, MD (US)

(72) Inventor: Francis J. Kub, Arnold, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/490,783

(22) Filed: Sep. 19, 2014

(65) Prior Publication Data
US 2015/0041762 A1 Feb. 12, 2015

Related U.S. Application Data

(63) Continuation of application No. 13/238,728, filed on Sep. 21, 2011, now Pat. No. 8,901,536.

(60) Provisional application No. 61/384,727, filed on Sep. 21, 2010.

(51) Int. Cl.
| *H01L 33/00* | (2010.01) |
| *H01L 29/737* | (2006.01) |
| *B82Y 10/00* | (2011.01) |

(Continued)

(52) U.S. Cl.
CPC .............. *H01L 29/7376* (2013.01); *B82Y 10/00* (2013.01); *H01L 29/1004* (2013.01); *H01L 29/157* (2013.01); *H01L 29/1606* (2013.01); *H01L 29/1608* (2013.01); *H01L 29/66037* (2013.01); *H01L 29/66068* (2013.01); *H01L 29/7371* (2013.01)

(58) Field of Classification Search
CPC .............. H01L 29/7376; H01L 29/157; H01L 29/1606; H01L 29/1004
See application file for complete search history.

(56) References Cited

U.S. PATENT DOCUMENTS

| 2004/0232505 | A1 | 11/2004 | Moddel | |
| 2007/0120110 | A1* | 5/2007 | Estes | B82Y 10/00 257/25 |
| 2008/0217603 | A1 | 9/2008 | Takeda et al. | |

(Continued)

OTHER PUBLICATIONS

Bart Van Zeghbroeck, "Chapter 5: Bipolar Junction Transistors," Principles of Semiconductor Devices, available online at http://ecee.colorado.edu/~bart/book/book/content5.htm (downloaded Jun. 15, 2011).

(Continued)

*Primary Examiner* — Whitney T Moore
*Assistant Examiner* — Joseph Galvin, III
(74) *Attorney, Agent, or Firm* — US Naval Research Laboratory; Joslyn Barritt

(57) ABSTRACT

A transistor device having a graphene base for the transport of electrons into a collector is provided. The transistor consists of a heterostructure comprising an electron emitter, an electron collector, and a graphene material base layer consisting of one or more sheets of graphene situated between the emitter and the collector. The transistor also can further include an emitter transition layer at the emitter interface with the base and/or a collector transition layer at the base interface with the collector. The electrons injected into the graphene material base layer can be "hot electrons" having an energy E substantially greater than $E_F$, the Fermi energy in the graphene material base layer or can be "non-hot electrons" having an energy E approximately equal to than $E_F$. The electrons can have the properties of ballistic transit through the base layer.

38 Claims, 13 Drawing Sheets

(51) Int. Cl.
*H01L 29/10* (2006.01)
*H01L 29/16* (2006.01)
*H01L 29/66* (2006.01)
*H01L 29/15* (2006.01)

(56) References Cited

U.S. PATENT DOCUMENTS

2010/0001319 A1* 1/2010 Pelouard ............... H01L 29/201 257/197
2010/0102298 A1* 4/2010 Wu ..................... H01L 27/0605 257/25
2010/0272140 A1 10/2010 Walter et al.
2011/0309335 A1* 12/2011 Mehr ..................... H01L 29/16 257/26

OTHER PUBLICATIONS

A.F.J. Levi et al., "Injected-Hot-Electron Transport in GaAs," Phys. Rev. Lett. 55(19), pp. 2071-2073 (1985).

M. Heiblum et al., "Direct Observation of Ballistic Transport in GaAs," Phys. Rev. Lett. 55(19), pp. 2200-2203 (1985).

J.R. Hayes et al., "Hot Electron Spectroscopy," Electron. Lett. 20(21), pp. 851-852 (1984).

J.M. Shannon, "Calculated performance of monolithic hot-electron transistors," IEE Proceedings 128(4), pp. 134-140 (1981).

M. Heiblum, "Tunneling Hot Electron Transfer Amplifiers (Theta): Amplifiers Operating Up to the Infrared," Solid-State Electronics 24, pp. 343-366 (1981).

A.C. Seabaugh et al., "Pseudomorphic Bipolar Quantum Resonant-Tunneling Transistor," IEEE Transaction on Electron Devices, vol. 36, pp. 2328-2333 (1989).

S. Mil'Shtein et al., "Bipolar Transistor with Quantum Well Base," Microelectronics Journal 39, pp. 631-634 (2008).

Chen et al., "Intrinsic and extrinsic performance limits of graphene devices on SiO2," Nature Nanotechnology 3, 206-209 (2008).

* cited by examiner

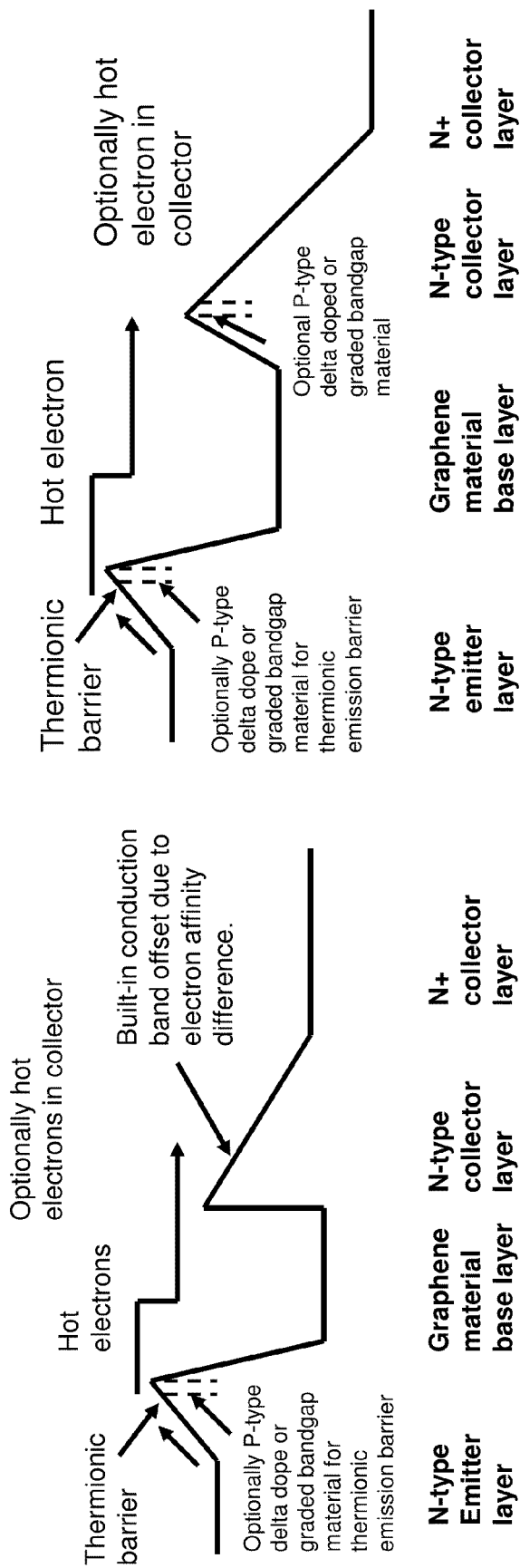

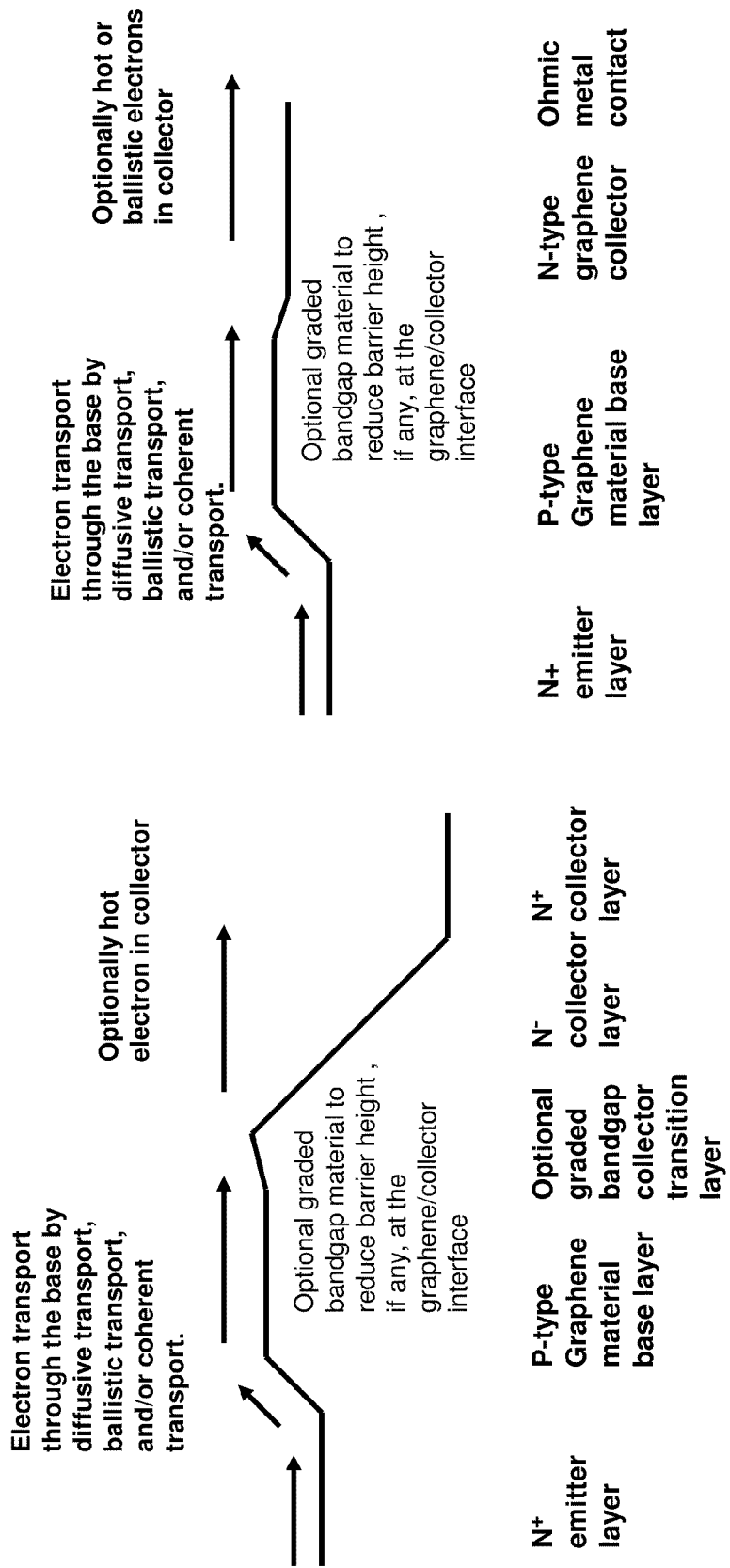

TRANSISTOR HAVING GRAPHENE BASE

CROSS-REFERENCE

This application is a Continuation of and claims the benefit of priority under 35 U.S.C. §120 based on U.S. patent application Ser. No. 13/238,728 filed on Sep. 21, 2011, which in turn is a Nonprovisional of and claims the benefit of priority under 35 U.S.C. §119 based on U.S. Provisional Patent Application No. 61/384,727 filed on Sep. 21, 2010, both of which are hereby incorporated by reference into the present application in their entirety.

TECHNICAL FIELD

The present invention relates to a three-terminal junction transistor, more specifically a three-terminal junction transistor having a graphene material base layer.

BACKGROUND

Three-terminal junction transistors have application to numerous electronic devices, including digital circuits, analog-to-digital converters, digital-to-analog converters, mixed-signal circuit, fiber-optic receivers, and microwave amplifiers.

A three-terminal transistor has an emitter, a base, and a collector with the base controlling the current transport from the emitter to the collector. Such a transistor can operate as a unipolar transistor having one predominant carrier transport type or as a bipolar transistor having two carrier transport types.

A unipolar transistor is typically designed to have electrons as the predominant carrier type. In addition, unipolar transistor device structure can be designed so that the carriers are hot electrons within the base of the transistor. If the base is thin, the carriers can have ballistic transport through the base. The unipolar transistor is typically operated primarily in the voltage-control mode with the injection of electrons from the emitter into the base controlled by varying the voltage difference applied between the emitter and base electrodes, with some portion of the electrons injected into the base transporting through the base and being collected by the collector.

The three-terminal transistor can also operate in a bipolar-mode where the injection of one carrier type (holes) into the base modulates the injection of a second carrier type (electrons) from the emitter into the base with some portion of the electron injected into the base transporting through the base and being collected in the collector. The bipolar transistor is typically operated primarily in the current-control mode.

The capabilities of these circuits are often rated by the speed of operation of the circuits. The speed of operation of the circuit type that utilizes three-terminal transistors is often dominated by the transit time of carriers through the base layer of the three-terminal transistor. Thus, it is often useful to use a thin base layer to achieve a fast carrier transit through the base layer.

One measure of the frequency performance capability of a three-terminal transistor is the transition frequency (cutoff frequency), fT, which is strongly dependent on the transit time of carrier through the base of a transistor. The maximum oscillation frequency Fmax for a bipolar transistor is approximately described by the equation $$F_{max} = \left(\frac{fT}{8\pi RbCcb}\right)^{1/2}$$

where Rb is the base resistance, Ccb is the collector base capacitance, and fT is the cutoff frequency. Thus, the maximum frequency of oscillation is inversely proportional to the base resistance Rb. See Bart Van Zeghbroeck, "Chapter 5: Bipolar Junction Transistors," *Principles of Semiconductor Devices*, available online at http://ecee.colorado.edu/~bart/book/book/content5.htm (downloaded Jun. 15, 2011).

It has been known for some time that a hot electron transistor (HET), and especially a ballistic transistor, can potentially be operated at frequencies in excess of those achievable with conventional (diffusive) transistors. T. E. Bell, "The Quest for Ballistic Action," *IEEE Spectrum*, February 1986, pp. 36-38. Various types of hot electron transistors (HET) have been proposed. See L. F. Eastman, "Ballistic Electrons in Compound Semiconductors," *IEEE Spectrum*, February 1986, pp. 42-45; A. F. J. Levi et al., "Injected-Hot-Electron Transport in GaAs," *Phys. Rev. Lett.* 55(19), pp. 2071-2073 (1985); M. Heiblum et al., "Direct Observation of Ballistic Transport in GaAs," *Phys. Rev. Lett.* 55(19), pp. 2200-2203 (1985); and M. I. Nathan et al., "A Gallium Arsenide Ballistic Transistor," *IEEE Spectrum, February* 1986, pp. 45-47.

One type of HET transistor has a thin P-type doped emitter material layer in the emitter transition layer at the emitter/base interface that implements a thermionic emission injection structure, also known as a planar doped barrier or a camel barrier, and a thin P-type collector material layer in the collector transition layer at the collector/base interface that implements a collector barrier, see J. R. Hayes et al., "Hot Electron Spectroscopy," *Electron. Lett.* 20(21), pp. 851-852 (1984); J. M. Shannon, "Calculated performance of monolithic hot-electron transistors," *IEE Proceedings* 128(4), pp. 134-140 (1981).

Another type of transistor uses tunnel injection and comprises emitter, base, and collector, with an appropriately shaped potential barrier between emitter and base, and a second barrier between base and collector. This second type, which is referred to as a tunneling hot electron transfer amplifier (THETA), differs from the first type in having tunnel injection into the base. See M. Heiblum, "Tunneling Hot Electron Transfer Amplifiers (Theta): Amplifiers Operating Up To The Infrared," *Solid-State Electronics* 24, pp. 343-366 (1981).

Both of the above types are unipolar, although bipolar HETs have also been proposed.

Other types of bipolar transistors with thin base layers include a Bipolar Quantum Resonant Tunneling Transistor. See A. C. Seabaugh et al., "Pseudomorphic Bipolar Quantum Resonant-Tunneling Transistor," *IEEE Transaction on Electron Devices*, Vol. 36, pp. 2328-2333; and S. Mil'shtein et al., "Bipolar Transistor with Quantum Well Base," *Microelectronics Journal* 39, pp. 631-634 (2008). This device structure utilizes tunneling potential barriers at the emitter/base interface and the collector/base interface to establish a potential well with distinct allowed energy levels in the base layer. Electrons tunnel through the tunnel barrier at the emitter/base interface, enter allowed energy levels in the base, transit through the base, and then tunnel through the tunnel barrier at the collector/base interface and then enter the collector.

The flow of electrons from emitter to base is controlled in both types by varying the emitter/base barrier potential by means of an applied voltage $V_{eb}$. The flow of electrons from the base to the collector can is made favorable by means of an externally applied voltage $V_{bc}$ between base and collector. Under normal operating conditions, $V_{bc}$ reverse biases the base/collector junction. Electrons injected from the emitter into the base have energy substantially greater than the thermal energy of the ambient electrons in the base. These "hot" electrons ideally traverse the base without undergoing significant scattering. If the barrier at the base/collector interface is lower than the hot electron energy, then some of the hot electrons can cross the barrier, be transmitted through the depletion region of the collector, and enter the sea of conduction electrons in the collector.

One of the critical parameters for transistors is the base resistance. A low base resistance is important to achieve a high maximum frequency of oscillation, fmax.

Graphene is a monolayer of conjugated $sp^2$ bonded carbon atoms tightly packed into a two-dimensional (2D) hexagonal lattice. One of the primary advantages of graphene is that it has extremely high intrinsic carrier (electron and hole) mobility and thus has extremely high electric conductivity. Graphene has the potential to have the highest conductivity and lowest resistivity of any material, with a conductivity even higher than that of silver. See Chen et al., "Intrinsic and extrinsic performance limits of graphene devices on $SiO_2$," *Nature Nanotechnology* 3, 206-209 (2008).

For example, experimental results indicate that the resistivity of a single sheet of graphene approximately 3 angstrom thick grown on the silicon face of SiC has a sheet resistance on the order of 750 ohm/square to 1000 ohms/square, while a graphene sheet grown on the surface of copper can have a sheet resistance of approximately 1200 to 1500 ohms/square. In some cases, the sheet resistance of few sheets of graphene can be even less, as little as 100 ohms/square. Chen et al., supra.

The high electrical conductivity of graphene allows the use of a extremely thin graphene material base layer, even one comprising only a single graphene sheets and having a thickness of approximately 0.28 nm for a single sheet of graphene.

Use of such a thin graphene base layer reduces the transit time of electrons through the base layer and also reduces the energy loss of hot electrons in transiting the thin graphene base material. In addition, the high velocity of electrons in the graphene material can lower the base transit time. Thus, the semiconductor device with a graphene material base layer can have high fT and high fmax.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a transistor device having a graphene base for controlling the transport of electrons from the emitter to a collector.

The transistor of the present invention consists of a heterostructure comprising an electron emitter, an electron collector, and a graphene material base layer consisting of one or more sheets of graphene situated between the emitter and the collector. The emitter typically contacts a first surface of the graphene material base layer to form an emitter/base interface. The collector typically contacts the graphene material base layer at a second surface thereof opposite the first surface to form a base/collector interface.

The graphene material base layer can be either an N-type graphene material or a P-type graphene material or a combination of N-type and P-type graphene material.

In some embodiments, the emitter contains an emitter transition layer disposed at the emitter interface with the graphene material base layer (emitter/base interface).

In some embodiments, the collector contains a collector transition layer disposed at the collector interface with the graphene material base layer and the collector (collector/base interface) to facilitate the collection of electrons that transit the graphene material base layer into the collector and to allow a voltage to be applied between the graphene base material layer and the N-type collector.

In the case of non-hot electron injection, the material used for the collector should have a potential that is lower than that of the graphene material base layer so that there is not a potential barrier at the transition layer between the base layer and the collector. Materials that can be used for the collector in such cases include CdSe, InAs, SnO2: F, InSb, ZnO, BN, CdTe, CdS, In2O3:Sn, InGaN, InAsP, InP, InGaAs, InAlAs, InGaSb, and diamond.

BRIEF DESCRIPTION OF THE DRAWINGS

FIGS. 2A-2F depict conduction band minimum diagrams and bathers for hot electron injection for various exemplary embodiments of a transistor having a graphene base in accordance with one or more aspects of the present invention FIGS. 3A and 3B depict conduction band minimum diagrams for non-hot electron graphene base transistors.

DETAILED DESCRIPTION

Figures 1A, 1B:
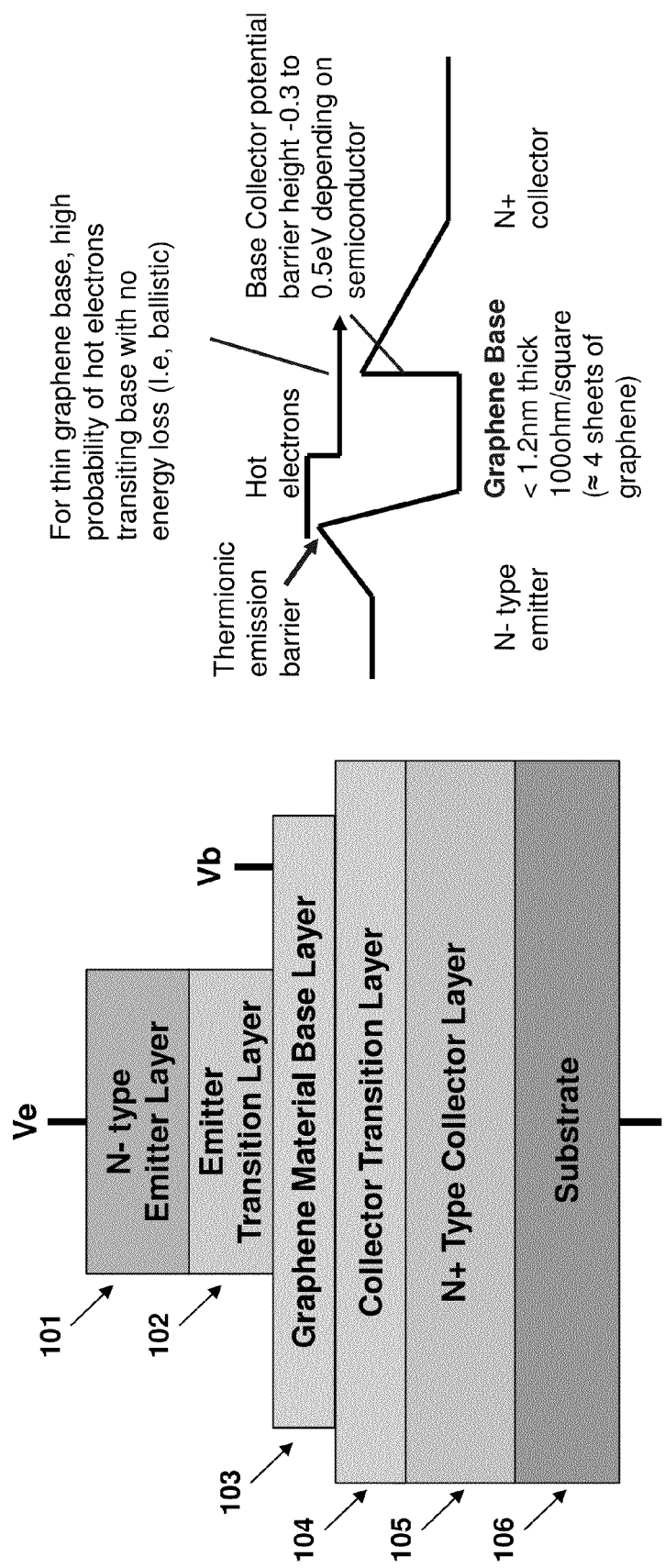
FIGS. 1A and 1B depict aspects of a general exemplary embodiment of a transistor having a graphene base in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a three-terminal junction transistor device having a graphene base.

The following terms are used in the present disclosure. It should be noted, however, that the definitions presented are for ease of reference only and are not intended to limit the scope or spirit of the inventions described herein.

Electrons are considered to be "ballistic electrons" if they pass through the base layer and optionally the collector at a high speed (ballistic conduction), interacting substantially only with the static part of the lattice potential in addition to its possible interaction with an accelerating electric field. Electron transport may be "ballistic" even though the electrons undergo some small angle scattering and/or small energy change.

A conduction electron herein is considered to be a "hot" electron in a given layer of the transistor if its energy E is substantially greater than $E_F$, the Fermi energy in the layer. Typically, $E > E_F + 10 k_B T$, where $k_B$ is the Boltzmann constant, and T is the absolute temperature of the lattice.

A "hot electron transistor" (HET) is a transistor whose operative characteristics are in substantial part determined by the transport of hot electrons through the transit region of the transistor, with minimal scattering of the hot electrons in the transit region.

The "transit region" of a HET herein is that portion of the HET through which substantial hot electron transport takes place, or is intended to take place. For instance, in a PDBT, camel transistor, or THETA device, the transit region consists of the base and the collector depletion region. In order to have the possibility of significant hot electron transport in a HET, the width of the transit region has to be less than the mean-free path of the hot electrons in the material.

The term "SMHEI" is used to refer to Semiconductor Materials for Hot Electron Injection and is used to describe materials that can be used for the emitter and/or the collector in a graphene base transistor device in accordance with the present invention in which hot electrons are injected into the graphene base.

The term "SMNHEI" is used to refer to Semiconductor Materials for Non-Hot Electron Injection and is used to describe materials that can be used for the emitter and/or the collector in a graphene base transistor device in accordance with the present invention in which non-hot electrons are injected into the graphene base.

As described in more detail below, the transistor of the present invention consists of a heterostructure comprising an electron emitter, an electron collector, and a graphene material base layer consisting of one or more sheets of graphene situated between the emitter and the collector. The emitter typically contacts a first surface of the graphene material base layer to form an emitter/base interface. The collector typically contacts the graphene material base layer at a second surface thereof opposite the first surface to form a base/collector interface.

The graphene material base layer can be either an N-type graphene material or a P-type graphene material or a combination of N-type and P-type graphene material.

The use of graphene for the base layer of the transistor can enable a thin base layer that allows short transit time for electrons through the graphene material base layer. The use of graphene for the base layer also allows a base layer with a low resistance that increases the maximum frequency of oscillation of the bipolar transistor. The use of graphene for the base layer of a transistor can allow high performance wide bandgap materials such as AlGaN, GaN, InAlN, and SiC for the collector of the transistors. Wide bandgap materials such as AlGaN, GaN, InAlN and SiC have extremely high Johnson figure of merit and thus the graphene base transistor can allow high power, high frequency operation. The wide bandgap nature of AlGaN, GaN, InAlN and GaN, the graphene base transistor can also allow high temperature operation. In addition, the enhanced lateral thermal conductivity of graphene can spread the thermal load to a larger area and thus reduce the thermal resistance. Finally, the use of graphene for the base layer also can lower the transistor turn-on voltage thereby reducing power dissipation within the device.

While a single layer graphene has a zero voltage bandgap, a bi-layer graphene material layer consisting of two sheets of graphene can have a bandgap of approximately 250 millielectron volts. A single layer graphene sheet can also have a bandgap by forming the graphene sheet into nanoribbons, patterned hydrogen absorption, or an antidot design. The signal layer graphene sheet can also have a bandgap by doping with appropriate atoms. See R. Balog, et al. "Bandgap opening in graphene induced by patterned hydrogen absorption," Nature Materials, Vol. 9. pp. 315-319, (2010).

In some embodiments, the emitter contains an emitter transition layer disposed at the emitter interface with the graphene material base layer (emitter/base interface) to implement a thermionic emission injection structure, a planar doped barrier thermionic emission injection structure, a camel thermionic emission injection structure, a N-type/i-layer/P-type/i-layer (NIPI) doping superlattice injection structure, a superlattice injection structure, a graded bandgap thermionic emission structure, a tunneling injection structure, a metal-oxide tunnel injection structure, a Fowler Nordheim injection structure, a resonant tunneling injection structure, or other barrier known to those skilled in the art for hot electron injection into the graphene material base layer.

In some embodiments, the collector contains a collector transition layer disposed at the collector interface with the graphene material base layer and the collector (collector/base interface) to facilitate the collection of electrons that transit the graphene material base layer into the collector and to allow a voltage to be applied between the graphene base material layer and the N-type collector.

The electrons injected into the graphene material base layer can be "hot electrons" having an energy E substantially greater than $E_F$, the Fermi energy in the graphene material base layer. The injected electrons can also have the properties of ballistic transit through the base layer, can be tunneling electrons through the base layer, can be resonant tunneling electrons through the base layer, and/or can transit the base layer as coherent electrons see A. F. J. Levi, "Ultrahigh-Speed Bipolar Transistor," Physics Today, pp. 58-64 (February 1990).

In other cases, by forward biasing the emitter/base junction, electrons can be injected into the base as "non-hot electrons" having an energy E approximately equal to $E_F$ The non-hot electrons can still having the properties of ballistic transit through the base layer. The non-hot electron transport through the base being effectuated by diffusive transport, ballistic transport, tunneling transport, resonant tunneling transport, and/or coherent transport.

Semiconductor materials that can be used in the emitter for injection of hot electrons into the graphene material base layer can include any one of AlGaN, InAlN, ZnO, BN, InGaN, InAsP, InP, InGaAs, InAlAs, InGaSb, Diamond, GaN, GaAs, silicon, SiC, GaSb, Germanium, AlP, ZnS, GaP, AlSb, AlAs, InGaN, and AlN emitter material layers. The emitter can comprise one or more semiconductor emitter material layers, in some embodiments including an emitter transition layer and/or one or more tunneling insulator or tunneling semiconductor layers. Any one of the emitter material layer can be single-layer, polycrystalline, highly oriented, nanocrystalline, amorphous material layer.

The emitter in the hot electron case can have varying dopant concentrations within each of the semiconductor emitter material layers, very often having a high N-type dopant concentration region in contact with the metal electrode connection to the emitter to achieve low contact resistance. Any one of the emitter material layers can be N-type doped. Any one of the collector material layers near the emitter/base interface can be P-type doped, can contain a P-type delta doped layer, or can contain a graded P-type doped layer. The P-type doped layer, P-type delta doped layer, or graded P-type doped layer is one approach to implement a thermionic emission injection structure at the emitter/base interface and to aid in allowing a negative voltage to be applied to the N-type emitter relative to the base layer without a low resistance connection between the base and collector. A preferred operation mode is to be able to apply a reverse bias between the base and collector without excessive current flow because of a low resistance between base and collector.

The emitter in the hot electron case can also be implemented using a metal material combined with an tunnel insulator injection structure with the tunnel insulator material implemented with materials such as $Al_2O_3$, BN, $HfO_2$, fluorinated graphene, graphane, doped graphene insulator, silicon nitride, silicon oxide, AlN, MgO, layered combinations of insulating materials, and other insulator materials known to those skilled in the art.

Semiconductor materials that can be used in the collector for the receipt of hot electrons can include any one of graphene, InGaN, InAsP, InP, InGaAs, InAlAs, InGaSb, Diamond, GaN, GaAs, silicon, SiC, GaSb, Germanium, AlP, ZnS, GaP, AlSb, AlAs, InGaN, and AlN. The collector can comprise one or more semiconductor material layers, in some embodiments including a collector transistor layer interposed between the graphene material base layer and the collector to provide a graded potential barriers at the base/collector interface to facilitate transport of carriers from the base layer to the collector. The collector can also contain a substrate such as metal, silicon, GaN, AlN, AlGaN ZnO, SiC, GaN, InP, InAs, germanium, GaSb, Diamond, GaP, ZnS, InGaAs, glass, quartz, ceramic, polycrystalline, single crystalline, amorphous. The substrate can be conductive, semi-insulating, or insulating.

The collector in the hot electron case can have varying dopant concentrations within each of the semiconductor material layers forming the collector, typically having an upper collector layer with a lower dopant concentration that can facilitate electric field spreading within the upper collector and allow the application of a voltage bias between the base layer and the collector without avalanche carrier generation breakdown. A base-to-collector high breakdown voltage can be obtained by a selection of a combination of semiconductor material bandgap, dopant concentration, and upper collector width.

Any one of the collector material layers can be N-type doped. The collector can typically also have a high N-type dopant concentration subcollector that can be used to form a low resistance ohmic contact to the collector electrode connection.

Any one of the collector material layers near the collector/base interface can be P-type doped or can contain a P-type delta doped layer, or can contain a graded P-type doped layer. The P-type doped layer, P-type delta doped layer, or graded P-type doped layer is one approach to implement a thermionic emission barrier at the collector/base interface and to aid in allowing a positive voltage to be applied to the N-type collector relative to the base layer without a low resistance connection between the base and collector.

A preferred operation mode is to be able to apply a reverse bias between the base and collector without excessive current flow because of a low resistance between base and collector.

The collector in the hot electron case can also be implemented using a metal material combined with an tunnel insulator injection structure with the tunnel insulator material implemented with materials such as $Al_2O_3$, BN, $HfO_2$, fluorinated graphene, graphane, doped graphene insulator, silicon nitride, silicon oxide, AlN, MgO, layered combinations of insulating materials, and other insulator materials knows to those skilled in the art.

In some cases, a bandgap-graded collector transition layer can be disposed at the collector interface with the graphene material base layer (collector/base interface) to facilitate the transport of carriers from the base layer to the collector.

In the non-hot electron case, materials that can be used in the emitter for injection of non-hot electrons into the base layer can include CdSe, InAs, SnO2:F, InSb, ZnO, BN, CdTe, CdS, In2O3:Sn, InGaN, InAsP, InP, InGaAs, InAlAs, InGaSb, and diamond. The emitter can comprise one or more semiconductor layers, in some embodiments including an emitter transition layer and/or one or more tunneling insulator or tunneling semiconductor layers.

The emitter in the non-hot electron case can have varying dopant concentrations within each of the semiconductor material layers, often having a high N-type dopant concentration region in contact with the metal electrode connection to the emitter to achieve low contact resistance. The emitter in the non-hot electron case can have a P-type doped layer.

The emitter in the non-hot electron case can also have an emitter transition layer that is similar to the transition layer that is used for the hot electron device structure. The emitter transition layer located at the interface between the emitter and graphene material base layer can have any one of a thermionic emission injection structure, a planar doped barrier thermionic emission injection structure, a camel thermionic emission injection structure, a graded bandgap thermionic emission structure, a N-type/i-layer/P-type/i-layer (NIPI) doping superlattice injection structure, a superlattice injection structure, a tunneling injection structure, a metal-oxide tunnel injection structure, a Fowler Nordheim injection structure, or a resonant tunneling injection structure.

The emitter in the non-hot electron case can also be implemented using a metal material combined with an tunnel insulator injection structure with the tunnel insulator material implemented with materials such as $Al_2O_3$, BN, $HfO_2$, fluorinated graphene, graphane, doped graphene insulator, silicon nitride, silicon oxide, AlN, MgO, layered combinations of insulating materials, and other insulator materials knows to those skilled in the art.

In the case of non-hot electron injection, the material used for the collector should have a potential that is lower than that of the graphene material base layer so that there is not a potential barrier at the transition layer between the base layer and the collector. Materials that can be used for the collector in such cases include CdSe, InAs, SnO2: F, InSb, ZnO, BN, CdTe, CdS, In2O3:Sn, InGaN, InAsP, InP, InGaAs, InAlAs, InGaSb, and diamond. In some cases, a bandgap-graded collector transition layer can be disposed at the collector interface with the graphene material base layer (collector/base interface) to provide a graded potential barriers at the base/collector interface to facilitate transport of carriers from the base layer to the collector.

The collector can also be implemented using a metal material combined with an tunnel insulator injection structure with the tunnel insulator material implemented with materials such as $Al_2O_3$, BN, $HfO_2$, fluorinated graphene, graphane, doped graphene insulator, silicon nitride, silicon oxide, AlN, MgO, layered combinations of insulating materials, and other insulator materials knows to those skilled in the art. The collector can contain a substrate such as metal, silicon, GaN, AlN, AlGaN ZnO, SiC, GaN, InP, InAs, germanium, GaSb, Diamond, GaP, ZnS, InGaAs, glass, quartz, ceramic, polycrystalline, single crystalline, amorphous. The substrate can be conductive, semi-insulating, or insulating.

In some embodiments, the graphene material base layer can be formed by epitaxial growth of graphene material on the surface of a SiC semiconductor that can also perform as a collector or collector transition layer material. In other embodiments, the graphene material base layer can be formed separately on a second substrate such copper, nickel, iron, cobalt, silicon carbide, and other substrates known to those skilled in the art and then be transferred and bonded to the surface of the collector or surface of the collector transition layer material.

The present invention will now be described in more detail below with reference to the attached Figures which form a part of the disclosure herein.

FIG. 1A depicts an exemplary general structure of a graphene base transistor device in accordance with the present invention.

In the exemplary structure shown in FIG. 1A, a graphene base transistor in accordance with the present invention includes an N-type emitter 101, an N-type collector 105 and a graphene material base layer 103 intermediate the emitter 101 and the collector 105 and forming interfaces therewith. Emitter layer 101 typically contacts a first surface of graphene material base layer 103 to form an emitter/base interface, while collector 105 typically contacts graphene material base layer 103 at a second surface thereof opposite the first surface to form a base/collector interface. For a topside emitter transistor structure, it is desirable that the material for the emitter 101 be deposited in a patterned selective growth approach to facilitate electric contact to the graphene base material layer. Subtractive etch approach are also possible for forming the topside emitter structure, but care is needed in performing the subtractive etch to only etch the emitter material and not etch the graphene material. The use of etch stop layers can facilitate a subtractive etch process for topside emitter formation.

In some embodiments, emitter 101 can include an emitter transition layer 102 adjacent to the graphene material base layer 103 to implement a thermionic emission injection structure, a tunneling injection structure, a Fowler Nordheim injection structure, or other injection structures known to those skilled in the art for hot electron injection into the graphene material base layer. The emitter transition layer 102 can also be optimized to inject non-hot electrons into the graphene base material layer.

In some embodiments, a collector transition layer 104 is disposed at the collector interface with the graphene material base layer graphene material base layer 103 and collector 105 to facilitate the collection of electrons that transit the graphene material base layer into the N-type collector and to allow a voltage to be applied between the graphene base material layer and the N-type collector.

The transistor device also includes metal electrodes Ve, Vb, and Vc configured to make electrical connection with emitter 101, graphene material base layer 103, and collector 105, respectively. The metal that is in contact with emitter 101 and graphene base material layer 103 can be selected so that the electrical connection is an ohmic electrical connection, while the metal that is in contact with collector 105 can be selected to make an ohmic electrical connection to the collector or to make a Schottky electrical connection to the collector, with a Schottky electrical connection being in some cases a preferred method of contact to the base layer for transferred substrate bipolar transistors.

In operation, a voltage difference (potential difference) is effected between emitter electrode Ve and graphene material base layer terminal Vb to modulate the number of electrons injected into the base layer. A voltage difference (potential difference) also is effected between the graphene material base layer electrode Vb and the collector electrode Vc to collect the electrons that are injected by the emitter that transit through the graphene material base layer and are collected into the collector.

As described in more detail below, in some embodiments emitter 101 can be fabricated from a semiconductor material such as an SMHEI or SMNHEI semiconductor material, while in other embodiments the emitter can be fabricated from a metal material, graphene, or other suitable material.

Graphene material base layer 103 may comprise one or more sheets of graphene that have N-type conduction properties (having predominantly electron conduction), one or more sheets that have P-type conduction properties (having predominantly hole conduction), or, in some embodiments, may comprise a layered structure having one or more sheets with N-type conduction properties and one or more sheets with P-type conduction properties, interlayered with one or more undoped sheets of graphene. In some cases, one or more of the top and the bottom graphene layers may be doped in a different way than the remaining graphene layers in the graphene material base layer. In some cases, as described in more detail below, the layers may be otherwise configured depending on the emitter or collector material used to improve the graphene's interaction with the emitter or collector. Graphene material base layer 103 may also may be configured to have quantum levels that inherently form in narrow potential wells.

Collector 105 may be fabricated from a semiconductor, a semimetal, a metal or one or more graphene sheets. In addition, collector may consist of a single N-type material layer formed on a silicon, germanium, InP, GaAs, InAs, InGaAs, GaSb, SiC, GaN, ZnO, AlN, or metal substrate using homoepitaxial growth, heterojunction epitaxial growth, psuedomorphic growth, methomorphic growth, graded epitaxial growth, direct wafer bonding, or transferred substrate approaches or may further include an N-type material layer formed on the N+ type subcollector material layer or substrate with or without a collector transition layer 104 disposed within collector 105 at the collector interface with the graphene material base layer graphene material base layer 103.

The transistor of the present invention can also be formed with a multiple mesa structure so that each of the collector, emitter and base layers can be independently contacted. Thus, in some embodiments, to facilitate electrical contact to the graphene material base layer, a SMHEI emitter can be selectively grown so that after selective growth and oxide etching, the graphene in the base layer is exposed so that a metal contact layer can be deposited on the exposed graphene material base layer. In other embodiments, to facilitate electrical contact to the graphene material base layer, a graphene material base layer contact can be formed with approximately vertical sidewalls, a dielectric spacer formed on the sides of the graphene base material layer contact using RIE, and emitter material layer deposited as known by those skilled in the art. To reduce surface recombination which can be detrimental to device performance, a passivation layer can be provided over exposed portions of the collector, emitter and base layers of the transistor.

Hot Electron Injection

If the conduction band minimum of the N-type emitter is higher than the conduction band minimum of the graphene material base layer, the electrons will be injected into the graphene material base layer with energy $E > E_f$, and the electrons will be known as "hot electrons" as described above. These "hot electrons" ideally traverse the base without undergoing significant scattering. If the conduction band minimum at the base/collector interface is selected to be lower than the hot electron energy, then some of the hot electrons can cross into the N-type collector and be transmitted through the depletion region of the collector to enter the sea of conduction electrons in the N-type collector.

The electrons that transit the base layer can be "ballistic electrons" described above, i.e., they pass through the base layer and optionally the upper collector at a high speed substantially without scattering (ballistic conduction). At least a substantial fraction of the injected hot electrons transit the base layer without substantial energy loss and cross the base/collector interface. The electrons that transit the base layer can also be coherent electrons.

Non-Hot Electron Injection

If the conduction band minimum of the N-type emitter is lower than the conduction band minimum of the graphene material base layer, the electrons will not be injected into the graphene material base layer as "hot electrons". In this case, the electrons can transit the base graphene material by diffusive transport, ballistic transport, and/or coherent transport. However, it should be noted that even if the electrons are injected into the graphene material base layer as not hot electrons, in some cases, they can be injected into the collector as hot electrons after they traverse the graphene material base layer.

Optional Emitter Transition Layer

As noted above, a graphene base transistor device in accordance with the present invention can optionally include an emitter transition layer disposed at the emitter interface with the graphene material base layer (emitter/base interface).

The purpose of the emitter transition layer is to inject electrons into the base layer with sufficient energy to transit the base layer and be collected in the collector and also to allow a voltage to be applied between the N-type emitter and the graphene base material layer with a high ratio of emitter current (IE) to base current (IB), i.e., high IE/IB ratio. Thus, it is desirable that the emitter transition layer be designed so that the injection of base current into the emitter is minimized. The hot electrons can lose energy as they transit the base layer due to optical phonon scattering and other scattering events. The energy at which the hot electrons are injected from the emitter into the base should include any additional energy needed to overcome the energy loss due to optical phonons and other scattering events during the transit of electrons through the base layer.

In the case of hot electron injection into the graphene material base layer, such an emitter transition layer can implement a tunneling barrier, a Fowler Nordheim injection barrier, a thermionic barrier, or other barrier known in the art for hot electron injection into the graphene material base layer, such as those illustrated in FIGS. 2A-2F described in more detail below.

Figure 2D:
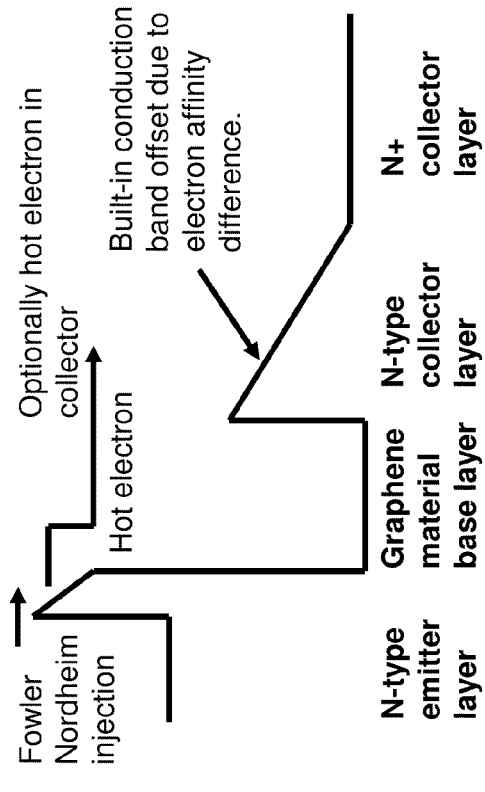
Figure 2C:
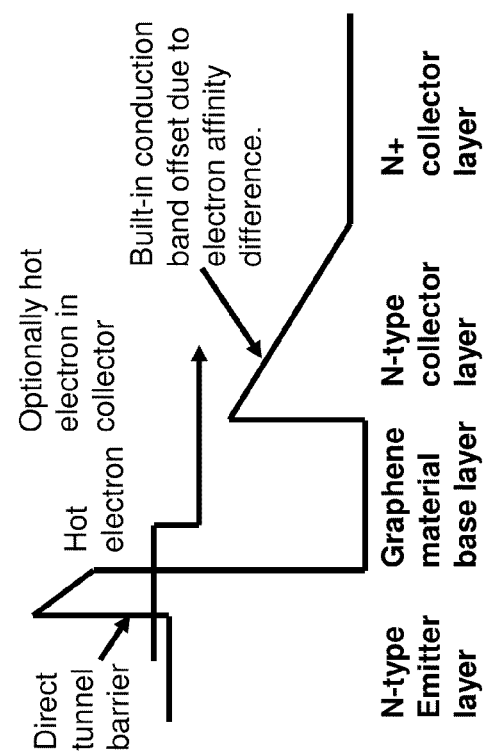
Figures 2E, 2F:
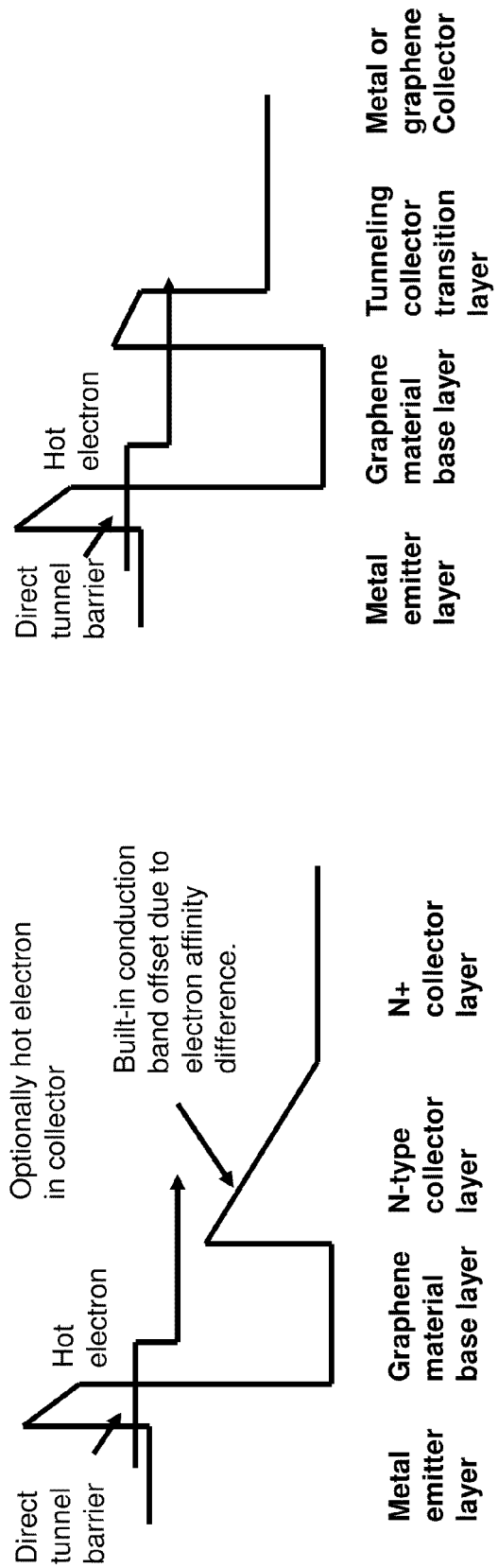

The emitter transition layer may comprise a P-type doped barrier layer or graded semiconductor material to provide a thermionic emission barrier as shown in FIGS. 2A and 2B; a tunneling insulator barrier layer, boron nitride layer, or semiconductor bather layer for direct tunneling such as that shown in FIGS. 2C and 2E; a thin insulator layer, a boron nitride layer, or semiconductor barrier layer for Fowler Nordheim injection such as that shown in FIG. 2D; or a resonant tunneling structure consisting of two semiconductor direct tunneling barriers such as that shown in FIG. 2F. An emitter transition layer can also take the form of an a NIPI type barrier layer, delta-doped barrier layer, planar doped barrier layer, a "camel" barrier layer, a superlattice semiconductor layer, a graphene layer converted to a tunneling insulating material, a fluorinated graphene tunneling layer, a graphane layer, a diamane layer, a semiconductor/graphene heterojunction, a semiconductor/graphene Schottky barrier, a thermionic barrier implemented as a result of electron affinity differences, a thermionic barrier implemented as a result of surface states and surface traps within the semiconductor bandgap at the semiconductor/graphene interface, a thermionic barrier implemented as a result of a "pinned" semiconductor/graphene interface, and combinations thereof.

For the case of "non-hot electron" injection into the graphene material base layer, the optional emitter transition layer disposed at the emitter interface with the graphene material base layer (emitter/base interface) can include bandgap smoothing graded semiconductor material to facilitate the injection of electrons from the emitter into the graphene material base layer, such as are illustrated in the conduction band minimum diagrams shown in FIGS. 3A and 3B.

In the exemplary device having the conduction band minimum diagram shown in FIG. 3A, an emitter comprising a N-doped semiconductor layer is disposed on a P-type graphene material base layer and the P-type graphene material base layer is deposed on a collector comprising a N-doped semiconductor layer. The collector has a positive bias relative to the graphene base (reverse bias) to allow collection of electrons that are injected from the emitter through the P-type graphene material base layer into the collector. In some embodiments, depending on the choice of the N-type semiconductor used in the collector material layer, an inherent potential barrier can exist between the P-type graphene material base layer and the N-type collector because of the inherent graphene-semiconductor conduction band offset. The N-type semiconductor can have bandgap grading to smooth the potential barrier that facilitates the transport of electrons from the graphene base layer into the collector.

The device having the conduction band minimum diagram shown in FIG. 3B has a N-type graphene material collector and P-type graphene material base. Only a small reverse bias voltage can be applied between base and collector because of small bandgap (in the case of bi-layer graphene or doped graphene) or no bandgap (in the case of single-layer graphene) of a graphene material layer. The electrons in the collector can have ballistic transport for a short distances into the graphene collector.

Optional Collector Transition Layer

Also as noted above, a graphene base transistor device in accordance with the present invention can optionally include a collector transition layer disposed at the collector interface with the graphene material base layer (collector/base interface).

The purpose of the collector transition layer is to facilitate the collection of electrons that transit the graphene base material layer into the N-type collector and also to allow a voltage to be applied between the graphene base material layer and the N-type collector. The collector transition layer can be designed to minimize the quantum mechanical reflection of the hot electrons by the collector transition layer.

In the case where an offset potential barrier exists between the conduction band minimum of the graphene material base layer and the conduction band minimum of the N-type collector, as in the case illustrated in FIG. 2B, the collector transition layer can be a bandgap smoothing transition region used to smooth the potential barrier (grade the potential in the collector transition layer) to facilitate the collection of electrons into the collector. In such cases, the bandgap smoothing transition region can comprise a layer of compositionally graded indium gallium arsenide (InGaAs) or InGaAsN or other semiconductor material.

In other cases for hot electron injection into the base layer, the collector transition layer may consist of a P-type doped layer, a NIPI type of layer, delta-doped layer, planar doped barrier layer, a "camel" layer, an insulator layer, a tunneling insulator layer, a boron nitride layer, a tunneling boron nitride layer, a tunneling semiconductor layer, a graded semiconductor layer, a superlattice semiconductor layer, a graphene layer converted to an insulating material, a fluorinated graphene layer, a heterojunction, a graphene Schottky barrier, and combinations thereof.

As described in more detail below, the materials that can be used for the emitter, collector, emitter transition layer, and collector transition layer may depend on the offset in potential of their conduction band minimums with respect to the conduction band minimum of the graphene material base layer. The offset potential is especially important for the determining how much energy the electrons in the graphene base layer must have to overcome the offset potential barrier at the collector base interface. It is often desirable that the collector material have high saturated electron drift velocity. It is also often desirable that the collector material have high breakdown electric field for impact avalanche of carriers. It is also desirable that the collector material layer that is in contact with the collector metal electrode connection facilitate the formation of low ohmic contact resistance. It is often desirable in the selection of emitter materials that the materials have a conduction band minimum that facilitates the injection of hot electrons into the graphene base material layer. It is also desirable that the emitter material layer that is in contact with the emitter metal electrode connection electrode facilitate the formation of low ohmic contact resistance.

The offset in potential of the conduction band minimum of the emitter material or collector material and the conduction band minimum of the graphene material base layer can be estimated by using the difference in electron affinity of the two material systems, for example, as shown in Table I below.

TABLE I

| Electron Affinity | | |
|---|---|---|
| Material | Electron Affinity | Conduction Band Offset from Graphene |
| Graphene | 4.5 eV | |
| CdSe | 4.95 eV | −0.45 eV |
| InAs | 4.9 eV | −0.4 eV |
| SnO2:F | 4.8 eV | −0.3 eV |
| InSb | 4.59 eV | −0.09 |
| ZnO | 4.5 eV or 4.35 | 0.0 eV or 0.15 eV |
| BN | 4.5 eV | 0.0 eV |
| CdTe | 4.5 eV | 0.0 eV |
| CdS | 4.5 eV | 0.0 eV |
| In2O3:Sn | 4.5 eV | 0.0 eV |
| InGaN | 4.1-4.59 eV | −0.4 eV |
| InAsP | 4.38 to 4.9 eV | −0.4 to 0.12 eV |
| InP | 4.38 eV | 0.12 eV |
| InGaAs | 4.1 to 4.9 eV | −0.4 to 0.4 eV |
| InAlAs | 4.1 to 4.9 eV | −0.4 to 0.4 eV |
| InGaSb | 4.1 to 4.59 eV | −0.09 to 0.4 eV |
| InN | 5.8 eV | −1.3 eV |
| Diamond | 4.2-4.5 eV | 0.0 to 0.3 eV |
| GaN | 4.1 eV or 4.3 eV | 0.2 or 0.4 eV |
| GaAs | 4.07 eV | 0.43 eV |

TABLE I-continued

| Electron Affinity | | |
|---|---|---|
| Material | Electron Affinity | Conduction Band Offset from Graphene |
| Silicon | 4.05 eV or 4.29 | 0.45 eV |
| 4H—SiC | 4.05 eV | 0.45 eV |
| GaSb | 4.05 eV | 0.45 eV |
| Germanium | 4.0 eV | 0.5 eV |
| AlP | 3.98 eV | 0.52 eV |
| ZnS | 3.9 eV | 0.6 eV |
| GaP | 3.8 eV | 0.7 eV |
| AlSb | 3.65 | 0.85 eV |
| AlAs | 3.5 eV | 1.0 eV |
| AlN | 0.6 eV | 3.9 eV |

Semiconductor Materials for "Non-Hot Electron" Graphene Transistors

Semiconductor, semimetal, and metal materials that have an electron affinity that is larger than that for graphene (i.e., larger than an electron affinity of 4.5 eV) will have a conduction band minimum that is smaller than the conduction band minimum of the graphene material base layer. By forward biasing the emitter base junction, electrons can injected into the graphene material base layers that are not hot electrons (Non-Hot Electron). From the electron affinity values in Table I, examples of candidate semiconductor materials for the emitter that have the potential to inject electrons in to the graphene material base layer that are Non-Hot Electrons include Semiconductor Material for Non-Hot Electron Injection (SMNHEI) CdSe, InAs, SnO2: F, InSb, ZnO, BN, CdTe, CdS, In2O3:Sn, InGaN, InAsP, InP, InGaAs, InAlAs, InGaSb, and diamond.

For the case that electrons that are injected into the graphene material base layer that are not hot electrons, it is desirable that there not be a potential barrier at the transition layer between the base layer and the collector. It is thus desirable that the collector consist of semiconductor, semimetal or metal layers that have a potential minimum that is lower than the potential minimum of the graphene material base layer. Examples of candidate semiconductors that can be used for the collector that have the potential to have a small potential barrier or no potential barrier at the collector transition layer include Semiconductor Material for Non-Hot Electron Collection (SMNHEC) CdSe, InAs, SnO2:F, InSb, ZnO, BN, CdTe, CdS, In2O3:Sn, InGaN, InAsP, InP, InGaAs, InAlAs, InGaSb, and diamond.

Bandgap grading approaches can also be used to reduce quantum mechanical reflection at the potential barriers at the collector transition layer.

Semiconductor Materials for "Hot Electron" Graphene Transistors

Semiconductor and semimetal materials that have an electron affinity that is smaller than the electron affinity of graphene (i.e., smaller than an electron affinity of 4.5 eV) have the potential to inject electrons into the graphene material base layers that are hot electrons. From the electron affinity values in Table I, examples of candidate Semiconductor Materials for Hot Electron Injection (SMHEI) that have the potential to inject hot electrons into the graphene material base layer include InGaN, InAsP, InP, InGaAs, InAlAs, InGaSb, Diamond, GaN, GaAs, Silicon, 4H-SiC, GaSb, Germanium, AlP, ZnS, GaP, AlSb, AlAs, InGaN, and AlN.

For the case that the material such InGaN, InAsP, InP, InGaAs, InAlAs, InGaSb, Diamond, GaN, GaAs, Silicon, 4H-SiC, GaSb, Germanium, AlP, ZnS, GaP, AlSb, AlAs, or InAlN, AlN is used for the collector, it will likely be necessary that the electron be injected in to base layer that are hot electrons to overcome the potential barrier that forms at the base collector.

Large Current Gain and Voltage Mode Operation for P-Type Graphene Material Base Layer Many of the emitter materials described above have a relatively small potential offset (or even negative potential offset for the case of hot electron injection) between the conduction band minimum in the emitter and the conduction band minimum in the graphene. Also, for many of the emitter materials described above, there is a relatively large potential offset between the valence band of the graphene and the valence band of the emitter material. Because of the large potential offset between valance bands, it will be difficult to inject holes from the P-type graphene material base layer into the valance band in the emitter material while at the same time, there is little potential offset to inject electrons from the emitter into the graphene material base layer.

Thus, the current gain of the graphene base transistor, defined as the ratio IE/IB, where IE is the electron injection from the emitter into the base layer and IB is the hole injection from the base layer into the emitter. The graphene base transistor will have a high current gain over most current levels of operation. It will be necessary to supply base current to the graphene base transistor to supply leakage current and recombination current, although at sufficiently high emitter current, the emitter current should be much larger than the base current and thus have high current gain.

Transistors with high current gain can also be described as having voltage mode operation. Voltage mode operation is desirable in many cases since the transistor base current for switching and modulation is determined by the need for capacitive charging rather than the need to inject current from the base layer into the emitter to change the potential offset of the emitter to the base layer to change the amount of electrons injected from the emitter into the base layer.

There are multiple growth techniques of forming P-type graphene material layers For example, graphene sheets that are grown on the carbon face of SiC are often P-type. See Y. M. Lin et al., "Multicarrier transport in epitaxial multilayer graphene," *Applied Physics Letters* 97, 112107 (2010). Graphene grown by CVD on a copper film are also doped P-type. Graphene layers formed by any such technique can be used in a transistor in accordance with the present invention.

Operation for N-Type Graphene Material Base Layer

For the case of hot electron graphene devices, transistor operation can be obtained for an N-type graphene material base layer. It can be desirable that appropriate insulating tunnel injection structure or P-type delta doped layers be incorporated in the emitter transition layer and the collector transition layer to allow appropriate biasing of the emitter relative to the base layer and appropriate biasing of the collector relative to the base layer. The presence of the insulating tunnel injection structure or P-type delta doped layer, for example, can allow electrons to be injected over a potential barrier or through an insulating tunnel layer into the graphene material base layer as hot electrons without a significant current flow from the base layer into the emitter. Alternatively, the emitter material can be selected so that there is a valance band offset between the emitter material and the valance band of the graphene material base layer, and in such a case, there will not be direct tunneling from the graphene material base layer into the valance band of the emitter material.

For a sufficiently high potential barrier at the base layer to collector interface, it may not be necessary to have an insulating tunnel injection structure or P-type delta doped material layer in the collector transition layer. For operation, it is necessary that a positive bias be applied to the collector relative to the base layer. For a sufficiently high potential barrier between the conduction band minimum in the base layer and the conduction band minimum in the collector at the base layer to collector interface, there will not be parasitic current flow form the base layer into the collector which is desirable for device operation.

High Temperature Operation

The bandgap of the graphene material base layer, if any, will have little variation with temperature. For emitter material with sufficiently large valance band offset, there will continue to be the mode of operation with essentially no hole injection from the graphene material base layer into the emitter. For sufficiently wide band material, there will be only small component of band-to-band leakage current in the emitter. However, with higher temperature of operation, the leakage current and generation current at the emitter/base interface, at the base layer/collector interface and on the surface of the graphene in the base layer will increase and additional base current is needed to accommodate the increased leakage current. Thus, it will be possible for the graphene base transistor to operate at high temperature if the defects at the emitter/base interface and base layer/collector interface are minimized or passivated.

Formation of the Material Layers

Aspects of the formation of the emitter, graphene material base layer, collector, and optional transition layers will now be described.

Forming the Emitter Material

The emitter material will typically be a semiconductor having N-type doping or a metal with an appropriate work function for injecting electrons into the graphene material base layer.

The emitter material may include semiconductor, semimetal, metal, tunneling insulator, or graphene material appropriate for injecting electrons into the graphene material base layer. The emitter material can be single-crystal material, polycrystalline material, high oriented material, amorphous material, metal material, and organic material.

The emitter material can be formed by deposition doping, or by direct bonding of emitter material (and optional emitter transition layer material) onto the surface of the graphene material base layer. The deposition approaches can include epitaxial growth, vapor phase growth, chemical vapor deposition (CVD) growth, plasma enhanced CVD growth, atomic layer epitaxy growth, atomic layer deposition growth, sputter deposition, ion beam deposition, E-beam evaporation, and other deposition techniques known to those skilled in the art.

In some embodiments, the emitter material is formed by epitaxial growth of single crystal or highly oriented material on the graphene material base layer. Many candidate emitter materials will have a large lattice mismatch to the graphene material base layers. Candidate epitaxial growth approaches include metamorphic, psuedomorphic, and Van der Waals epitaxial approaches and other epitaxial growth approaches known to those skilled in the art. Van der Waals epitaxy approach can be used to aid in accommodating the large lattice mismatch. The grains of the highly oriented, polycrystalline, or amorphous emitter material can be passivated with hydrogen atoms or fluorine atoms.

In other embodiments, the emitter is formed by doping. In such embodiments, a top graphene sheet or sheets can be doped N-type in a manner that is appropriate for injecting electrons into a P-type graphene material base layer. Approaches to dope graphene N-type include annealing in ammonia, annealing in nitrogen, and other approaches known to those skilled in the art. An N-type graphene/P-type graphene interface can act as a tunnel junction.

The emitter material may also be formed by wafer bonding emitter material to the graphene material base layer. The approaches include direct bonding semiconductor, semimetal, organic, or graphene sheet or sheets material to the surface of the graphene material base layer. One approach is to transfer and bond N-type graphene sheet or sheets to a P-type graphene material base layer. Other approaches include bonding a layered material having a thin semiconductor or thin semimetal layer on the surface. The thick portion of the layered material can then be selectively etched to leave a thin semiconductor or thin semimetal layer bonded to the surface of the graphene material layer.

An alternate approach to form a thin semiconductor, thin semimetal, or thin N-type graphene material layer bonded to the surface of the graphene material base layer is to use a Smart Cut approach of implanting hydrogen or helium to a depth within the thin semiconductor or thin semimetal layer, or beneath the thin semiconductor or semimetal layer. A heating operation then causes the hydrogen and or helium to expand, and split off the thick portion of the layer material as known to those skilled in the art. The remaining portion of the thick layered material can then be etched to the thin semiconductor, semimetal, or N-type graphene material layer.

SMHEI Emitter Material

In the case of hot electron injection into the graphene material base layer, the emitter can be formed from a Semiconductor Material for Hot Electron Injection (SMHEI) described above. The SMHEI is ideally grown in a manner to best accommodate the lattice mismatch to the graphene material base layer and minimize defects at the interface between the semiconductor material and the graphene material base layer. Annealing in hydrogen can be performed to passivate the defects in the SMHEI and at the interface of the SMHEI and the graphene material layer.

The SMHEI can consist of a layered structure formed from more than one type of semiconductor material or from layers of a single semiconductor material having different ratios of components of the elements of the semiconductor material or having different doping types and concentrations. It is preferred that the SMHEI be doped N-type, although in some embodiments there can be a thin P-type doped SMHEI in the emitter transition layer adjacent to the graphene base material layer to implement a thermionic emission injection structure to assist the injection of hot electrons into the graphene material base layer.

In some embodiments, SMHEI emitter material and if present, the optional emitter transition layer material, can be formed on the surface of the graphene material base layer by epitaxial growth. In a preferred embodiment, a single-crystal or highly oriented film of SMHEI is epitaxially grown on the surface of the graphene material base layer.

In other embodiments, the emitter can be formed by the deposition of polycrystalline, highly oriented, nanocrystalline, or amorphous SMHEI on the graphene material base layer.

In still other embodiments, the emitter material may be formed by wafer bonding SMHEI to the surface of graphene material base layer. The approaches include direct bonding of the SMHEI to the surface of the graphene material base layer. For example, the SMHEI can be grown on a silicon substrate and after bonding to the surface of the graphene material layer, the silicon substrate is etched away leaving the thin SMHEI bonded to the surface of the graphene material base layer. An alternate approach is to use a Smart Cut approach of implanting hydrogen or helium to a depth within the thin SMHEI or into the silicon layer beneath the thin SMHEI. A heating operation then causes the hydrogen and or helium to expand, and split off the thick portion of the layer material as known to those skilled in the art. The remaining portion of the thick layered material can then be etched to the thin semiconductor.

Metal or Semiconductor Tunnel Insulator Emitter Materials

The emitter and emitter transition layer can also be implemented by an insulator tunnel emission injection structure and a metal material for injections. The insulator tunnel barrier can be implemented with materials such as Al2O3, BN, HfO2, graphene, fluorinated graphene, doped graphene insulator, silicon nitride, silicon oxide, AlN, MgO, layered combinations of insulating materials, and other insulator materials knows to those skilled in the art. The insulator tunnel barrier material may be grown by atomic layer deposition, atomic layer epitaxy, CVD, PECVD, sputtering, ion beam deposition, and other techniques known to those skilled in the art. A metal layer in the emitter or N+ doped semiconductor or N+ doped semimetal can by the source of electrons that tunnel through the tunnel barrier and are injected into the base layer as hot electrons.

The emitter transition layer can be designed so that band bending due to surface states and fixed charge at the SMHEI/graphene interface form a thermionic emission injection structure that assists the injection of hot electrons in the graphene material base layer. The emitter transition layer can also include other structures that facilitate the injection of hot electrons into the graphene material base layer such as a P-type doped layer, a NIPI type of layer, delta-doped layer, an insulator layer, a tunneling insulator layer, a boron nitride layer, a tunneling boron nitride layer, a resonant tunneling structure, a tunneling semiconductor layer, a graded semiconductor layer, a superlattice semiconductor layer, a graphane layer, a graphene layer converted to an insulating material, a fluorinated graphene layer, a heterojunction, a Schottky barrier, and combinations thereof.

Forming the Graphene Material Base Layer

The graphene material base layer can be formed on the collector by epitaxial growth of one or more sheets of graphene on the surface of the collector material layer (or the surface of the optional collector transition layer material).

The graphene sheets can be P-type or N-type. There are multiple growth techniques of forming P-type graphene material layers. Graphene sheets that are grown on the carbon face of SiC are often P-type. Graphene sheets intercalated with gold is P-type. Graphene grown by CVD on a copper film are also doped P-type. Graphene sheets grown on the carbon face of SiC are often P-type. N-type graphene can be formed by annealing in ammonia ambient or in a nitrogen ambient. Graphene grown on the silicon face of SiC are often N-type.

Figure 4:
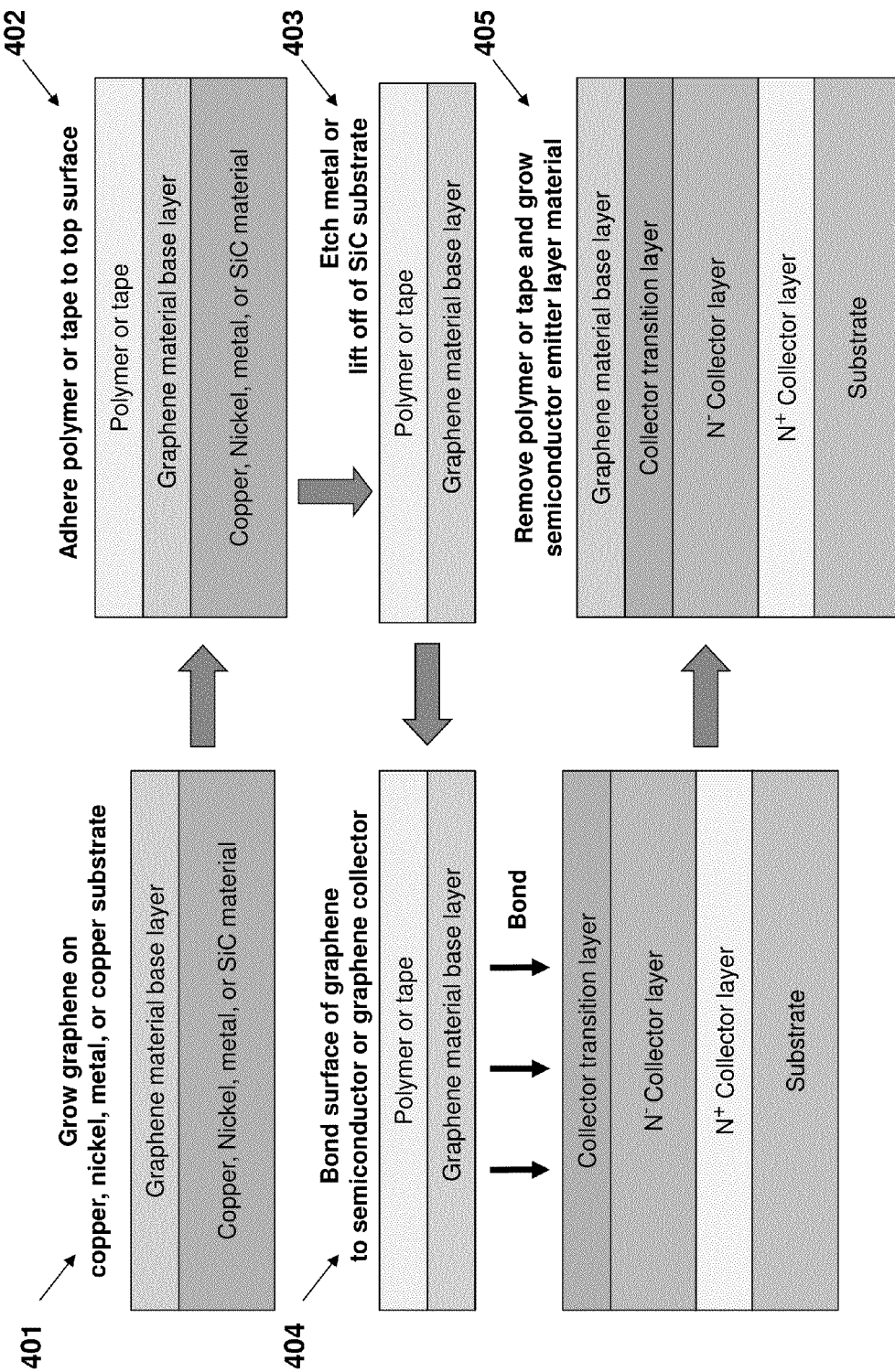
FIG. 4 depicts aspects of a processor the formation of a transferred and bonded graphene material base layer used in a graphene base transistor in accordance with the present invention.

The graphene material base layer can also be formed by the transfer of and bonding of one or more sheets of graphene that is grown on the surface of a substrate, as illustrated in FIG. 4. In the transfer and bond approach, in a first step 401, graphene material consisting of one or more sheets of graphene are first grown on a substrate such as SiC, copper, nickel or other substrates known by those skilled in the art using CVD, sublimation of silicon as is the case for SiC, or solution growth and by other techniques as known by those skilled in the art. In one example of the transfer and bond approach, in a second step 402, a heat releasable tape is adhered to the top surface of the graphene material that is formed on a substrate, and in a third step 403 the heat releasable tape is lifted from the surface of the substrate with graphene material attached to the bottom surface of the heat releasable table.

The surface of the collector material to receive the graphene sheet or sheets is suitably prepared for direct bonding of the graphene material. The process of suitably preparing the surface of the collector material may include appropriate cleaning and in some cases by appropriate treatment for improving the bond strength of the graphene material to the surface of the collector material.

In a fourth step 404, the surface of the graphene material is then brought into direct contact with the surface of the collector material and the bonding forces present between the surface of the graphene sheet and the collector material such as van der Waals bonding forces will bond the graphene sheet to the collector material. The bond strength of the graphene sheets to the collector material can be improved by appropriately charging the surface of the collector and/or graphene material by exposing the surface to plasma or corona. The bond strength of the graphene material to the collector material surface can also in some cases be improved by forming hydroxyl ions HO− on the surface of the collector material. Once the graphene sheets are bonded to the collector material, at a final step 405, the polymer tape is removed from the top surface of the graphene material so that the emitter or the emitter transition layer can be formed thereon.

In many cases, there are additional several factors that should be considered in forming the graphene material base layer.

It is sometimes the case that the mobility properties, doping properties, and/or bandgap of a graphene sheet are modified as a result of the graphene sheet being in contact with a material layer immediately above or below the graphene sheet. Thus, there can be an interaction between the graphene sheet that is immediately adjacent to the emitter that can affect the mobility properties, doping properties, or bandgap of that graphene sheet. Similarly, there can be an interaction between the graphene sheet that is immediately adjacent to the collector material that can affect the mobility properties, doping properties, or bandgap of that graphene sheet.

In addition, it can be preferable that the graphene sheet that is immediately adjacent to the emitter material be optimized for the growth of emitter material on the graphene sheet. The process of optimizing the graphene sheet for the growth of the emitter material can also affect the mobility properties, doping properties, and bandgap of that graphene sheet. In some cases, the optimization of such a graphene sheet can change the graphene sheet to a different type of material such as fluoridated graphene, graphane, dimane, hydrogenated graphene, carbon-based-material, doped graphene material, or other materials known to those skilled in the art so that it would no longer be considered strictly a graphene sheet.

Thus, in many cases it can be preferable that the graphene material base layer contain more than one graphene sheet situated one on top of the other in layers, with the graphene sheet adjacent to the emitter material being optimized for electrical interaction, carrier transport across the interface, surface states at the interface, band bending at the interface, wafer bonding bond strength, van der Waals bonding, covalent bonding, ionic bonding, and formation of nucleation sites for atom attachment for material growth with the emitter material; the graphene sheet that is adjacent with the collector material being optimized for electrical interaction, carrier transport across the interface, surface states at the interface, band bending at the interface, wafer bonding bond strength, van der Waals bonding, covalent bonding, and ionic bonding with the collector material; and the center graphene sheet or sheets having optimized mobility and thus low sheet resistance.

The number and properties of the graphene sheets in the graphene material base layer can be chosen to provide the selected base sheet resistance and the selected electron transmission probability through the graphene material base layer. For example, a graphene material base layer with five graphene sheets may have the outer (sheets adjacent to the emitter material layer and adjacent to the collector material layer) with degraded mobility, changed doping properties, or larger bandgap that degrades the resistance of the other layers leaving the three center graphene sheets with optimal or near optimal sheet resistance, doping properties, and bandgap properties. The thickness of the above example graphene material base layer with five sheet of graphene would be approximately 1.5 nm thick.

In addition, for the purposes of this invention, it is necessary that the electrons are able to transport across the interface between the graphene material base layer and the collector material. It is thus generally desirable that if insulating material such as a native oxide or deposited insulator or grown insulator exists on the surface of the collector material, the insulating material should be sufficiently thin that electrons can transit from the base layer into the collector (transit by tunneling) with only small perturbation to the electron transit across the interface.

In many cases it is desirable to not have an insulating material on the surface of the collector material so that electrons can readily transit from the base layer into the collector. In this case, the surface of the collector material is prepared in a suitable manner to minimize the native oxide on the surface. The surface of the collector material can also be prepared to minimize the number of surface states and band bending on the surface of the collector material. For example, it is known that forming fluorine atoms on the surface of GaN will remove the band bending at the surface of GaN.

There are other approaches for reducing surface states and band bending on the surface of the collector material and thus at the interface of the graphene sheets/collector material known by those skilled in the art. For example, in the case of a silicon surface, a process of exposing the surface to dilute hydrogen fluoride mixture in water removes the native oxide from the silicon surface and passivates the surface with a monolayer of hydrogen (hydrogen termination). The native oxide on a silicon carbide surface can also be largely removed by exposing the surface of silicon carbide to a mixture of dilute hydrogen fluoride and water. The native oxide on the GaN surface can be minimized by exposing the surface to high temperature ammonia gas, high temperature hydrogen gas, low temperature atomic hydrogen, or exposing the surface to liquid NaOH and water.

Exemplary embodiments of a graphene base transistor in accordance with the present invention will now be described, with reference in some cases to the Figures which form a part of the present disclosure.

Hot Electron Graphene Base Transistors

Hot Electron Embodiment 1

SMHEI Emitter/Graphene Material Base Layer/SiC Collector

In this embodiment, the collector is formed from SiC and the emitter is formed from an SMHEI material such as InGaN, InAsP, InP, InGaAs, InAlAs, InGaSb, Diamond, GaN, GaAs, silicon, SiC, GaSb, Germanium, AlP, ZnS, GaP, AlSb, AlAs, InGaN, or AlN.

An advantage of using SiC for the collector is that is that epitaxial graphene sheets can be grown on SiC by sublimation of silicon from the surface of the SiC. Thus, for this embodiment of the graphene base transistor, there is no need to transfer and bond graphene sheet or sheets to the surface of the collector material. It is well known how to form graphene sheets on the surface of a SiC substrate to those skilled in the art. For example, epitaxial graphene sheets can be formed on SiC by heating a SiC substrate to approximately 1550 C in argon ambient. The silicon atoms on the surface of the SiC sublimate forming a sheet or sheets of graphene on the surface of SiC.

In this embodiment, an N-type doped epitaxial layer of SiC can be first grown on an N+ SiC substrate (for backside collector contact) or alternately, an N-type doped SiC epitaxial layer can be first grown on a SiC semi-insulating substrate (for topside collector contact). The preferred off cut orientation for the growth of SiC epitaxial layers on SiC is in the range of zero degrees to eight degrees. A graphene material base layer is next grown on the surface of the N-type epitaxial SiC layer using the sublimation epitaxial growth techniques described above. The graphene material base layer that is grown on the silicon face of SiC face is typically one to two graphene sheets thick. The graphene material base layer that is grown on the carbon face of SiC is typically approximately 30 graphene sheets thick. Thus, the base resistance will be lower for the graphene material base layer grown on the carbon face of SiC compared to the graphene material layer that grown on the silicon face of SiC.

In some cases, the emitter can be formed from polycrystalline silicon (also known as polysilicon), Highly Oriented silicon, or Epitaxial Silicon.

The polysilicon layer is typically deposited by CVD or MBE techniques. The polysilicon layer can be entirely N+ doped, or can consist of a layered structure having an emitter transition layer of a thin P-type polysilicon thermionic emission injection structure deposited on the graphene material base layer and an N+ polysilicon deposited on the P+ polysilicon layer to function as the source for electrons for injection of hot electrons into the base layer of the graphene. The defects in the polysilicon layer can be passivated by diffusing hydrogen or fluorine into the polysilicon material as known by those skilled in the art.

To facilitate electrical contact to the graphene material base layer, the polycrystalline silicon material layer can be selectively grown so that after selective growth and oxide etching, the graphene in the base layer is exposed. Alternately, to facilitate electrical contact to the graphene material base layer, graphene material base layer contact can be formed with approximately vertical sidewalls, dielectric spacer formed on the sides of the graphene base material layer contact using RIE, and the emitter material layer deposited as known by those skilled in the art.

Hot Electron Embodiment 2

Graphene Material Base Layer Transferred and Bonded to Semiconductor Collector Material The approach to implement this embodiment is the same as described in Hot Electron Embodiment 1 except that the graphene material base layer is implemented by transferring and bonding graphene sheet or sheets to the surface of a semiconductor collector material. The graphene material sheets that will be used for the transfer process can be formed on a SiC substrate, a copper substrate, a nickel substrate and other substrates known as known to those skilled in the art. Graphene sheet or sheets can also be transferred to the surface of the semiconductor based collector material from graphene formed in solution. It is desirable that the semiconductor collector material and substrate material be temperature compatible with the SMHEI material growth process and it is also desirable that the semiconductor collector material and substrate material have a similar thermal expansion coefficient as the SMHEI.

Examples of candidate device structure consist of InGaN, InAsP, InP, InGaAs, InAlAs, InGaSb, Diamond, GaN, GaAs, Silicon, 4H-SiC, GaSb, Germanium, AlP, ZnS, GaP, AlSb, AlAs, or InAlN, AlN and other semiconductor collector material, a base layer consisting of a base graphene layer and an emitter consisting of SMHEI semiconductor material with optimized emitter transition layer and optimized collector transition layer.

"Non-Hot Electron" Base Transport Embodiments

Graphene Material Base Layer Transferred and Bonded to Semiconductor Collector Material The approach to implement this embodiment is the same as described in Hot Electron Embodiment 1 except that the graphene material base layer is implemented by transferring and bonding graphene sheet or sheets to the surface of a semiconductor collector material and emitter semiconductor material and collector semiconductor material are selected so that the electrons are not injected into the base graphene layer as hot electrons. Candidate semiconductor materials for the emitter are the Semiconductor Material for Non-Hot Electron Injection (SMNHEI) described above. Candidate semiconductor materials for the collector are the Semiconductor Material for Non-Hot Electron Collection (SMNHEC) described above.

The graphene material sheets that will be used for the transfer process can be formed on a SiC substrate, a copper substrate, a nickel substrate and other substrates known as known to those skilled in the art. Graphene sheet or sheets can also be transferred to the surface of the semiconductor based collector material from graphene formed in solution.

It is desirable that the SMNHEI semiconductor material growth process and anneal process be temperature compatible and have a similar thermal expansion coefficient with the SMNHEC material and the substrate material.

Examples of candidate device structure consist of SMNHEC or other semiconductor collector material, a base layer consisting of a base graphene layer and an emitter consisting of SMNHEI semiconductor material with optimized emitter transition layer and optimized collector transition layer.

Aspects of specific exemplary embodiments of a transistor in accordance with the present invention are illustrated in FIGS. 4A-4B through 10A-10B.

Figures 5A, 5B:
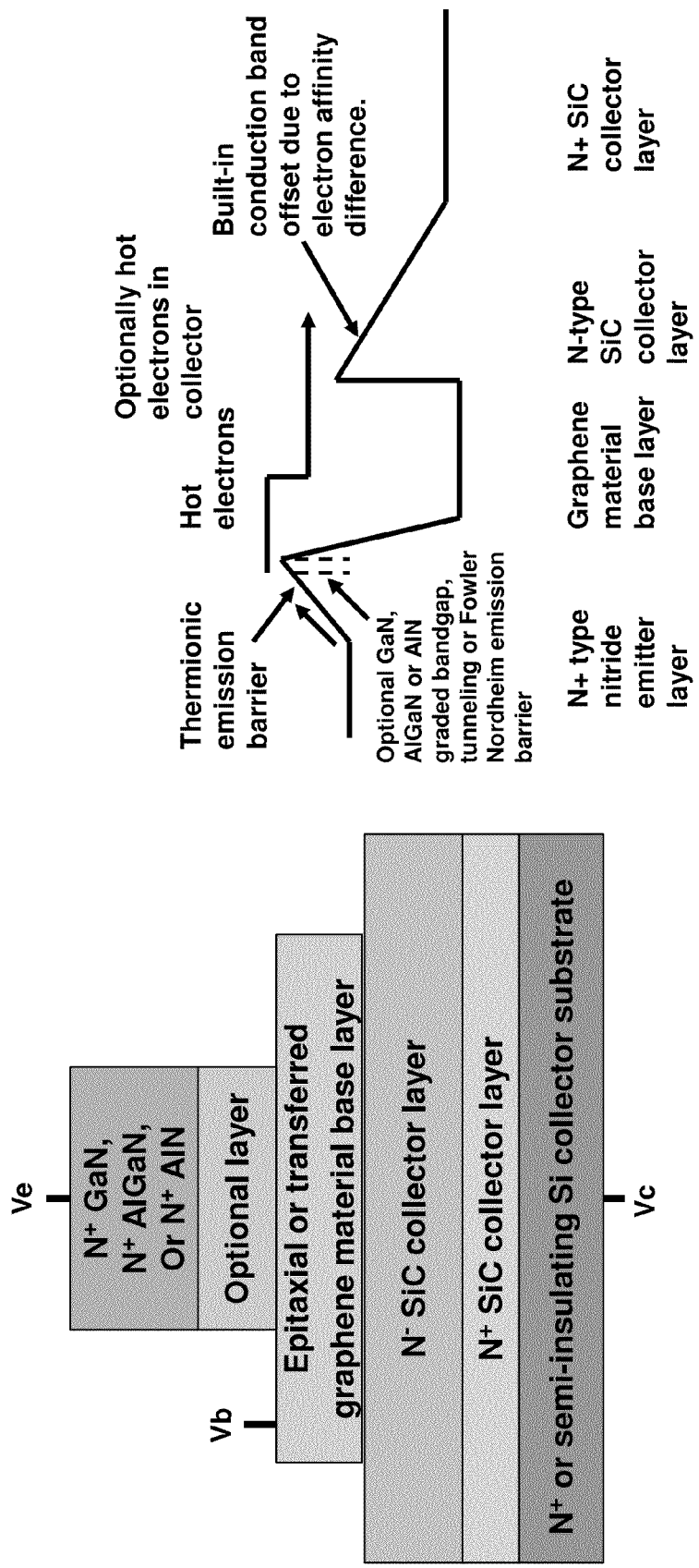
FIGS. 5A-5B depict aspects of an exemplary embodiment of a hot electron transistor having a graphene base in accordance with the present invention.

FIGS. 5A-5B: GaN, AlGaN, or AlN Emitter.

As shown in FIG. 5A, an exemplary transistor in accordance with the present invention can have an emitter made from N+ GaN, N+ AlGaN, or N+ AlN; an optional emitter transition layer made from AlN, AlGaN, and/or GaN to form a graded thermionic emission injection structure, tunnel injection structure, Fowler Nordheim injection structure, or resonant tunneling injection structure; an epitaxial or transferred graphene material base layer; an N− SiC collector; and an N+ SiC sub collector, all of which is disposed on an N+ or semi-insulating SiC substrate.

As seen from the conduction band diagram in FIG. 5B, hot electrons can be injected from the emitter, travel through an emission barrier formed by the optional layer, and enter into the graphene material base layer. The electrons then traverse the base layer and may enter the SiC collectors optionally as hot electrons, depending on the energy of the electrons in the base, and then thermalize to the SiC conduction band minimum to be non-hot electrons in the SiC. There is a built-in conduction band offset at the interface of the N− SiC collector with the graphene due to the electron affinity difference between graphene and SiC that the hot electrons in the graphene base must overcome to enter into the collector.

Figures 6A, 6B:
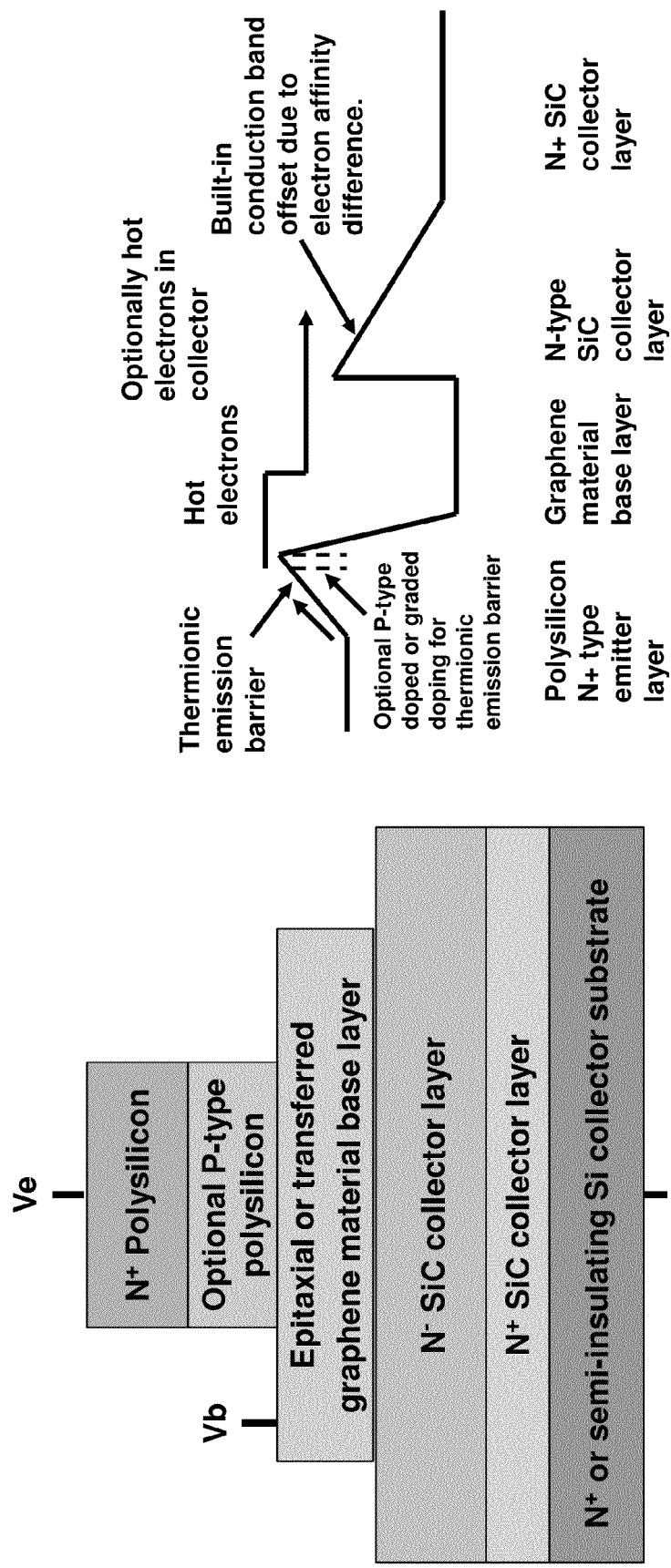
FIGS. 6A-6B depict aspects of a second exemplary embodiment of a hot electron transistor having a graphene base in accordance with the present invention.

FIGS. 6A-6B: Polysilicon Emitter.

As shown in FIG. 6A, a transistor device in accordance with this embodiment of the present invention can have an N+ polysilicon emitter; an optional emitter transition layer made of P-type doped or graded-doped polysilicon to provide a thermionic emission barrier between the emitter and the base layer; an epitaxial or transferred graphene material base layer; an N− SiC collector; and an N+ SiC collector, all disposed on an N+ or semi-insulating Si collector substrate.

As seen from the conduction band diagram in FIG. 6B, hot electrons can be injected from the N+ polysilicon emitter, travel through an emission barrier formed by the optional P-type polysilicon layer, and enter into the graphene material base layer. The electrons then traverse the base layer and enter the SiC collectors optionally as hot electrons, depending on the energy of the electrons in the base layer, and then thermalize to the SiC conduction band minimum to be non-hot electrons in the SiC. There is a built-in conduction band offset at the interface of the N− SiC collector with the graphene due to the electron affinity difference between graphene and SiC that the hot electrons in the graphene base must overcome to enter into the collector.

Figures 7A, 7B:
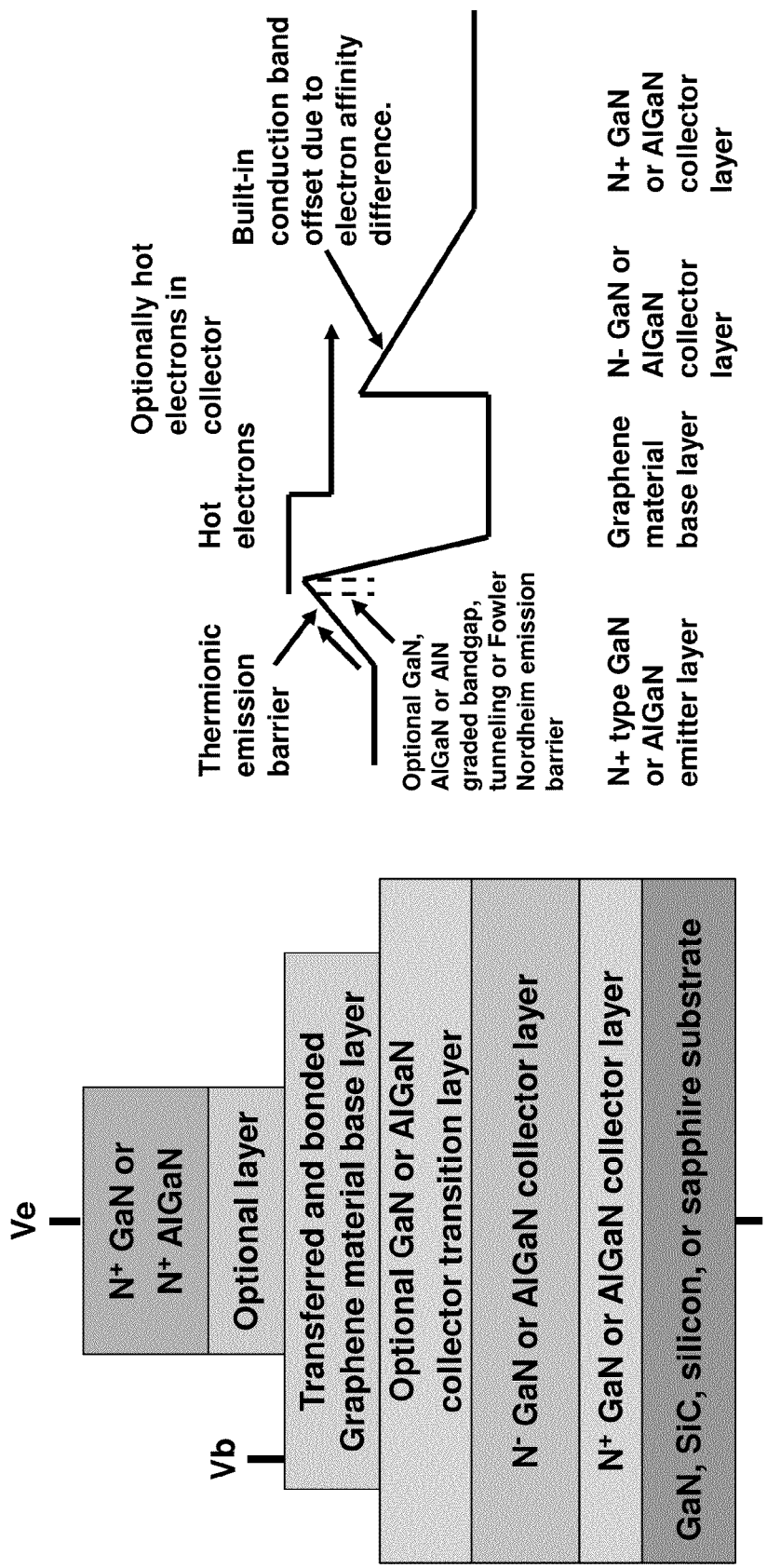
FIGS. 7A-7B depict aspects of a third exemplary embodiment of a hot electron transistor having a graphene base in accordance with the present invention.

FIGS. 7A-7B: N+ GaN or N+ AlGaN Emitter.

As shown in FIG. 7A, a transistor device in accordance with this embodiment of the present invention can have an N+ GaN or N+ AlGaN emitter; an optional emitter transition layer made from AlN, AlGaN, and/or GaN to form a graded thermionic emission barrier injection structure, tunnel barrier injection structure, Fowler Nordheim injection structure, or resonant tunneling injection structure; a transferred and bonded graphene material base layer; an optional GaN or AlGaN collector transition layer; an N− GaN or AlGaN collector; and an N+ GaN or AlGaN collector, all disposed on a GaN, SiC, silicon, or sapphire substrate.

As seen from the conduction band diagram in FIG. 7B, hot electrons can be injected from the N+ GaN or N+ AlGaN emitter, travel through an emission barrier injection structure formed by the optional AlN, AlGaN, and/or GaN layer, and enter the graphene material base layer. The electrons then traverse the base layer may enter the collectors optionally as hot electrons as described above, with the N− GaN or AlGaN collector providing a built-in conduction band offset due to the electron affinity difference between graphene and GaN or AlGaN layer.

Figures 8A, 8B:
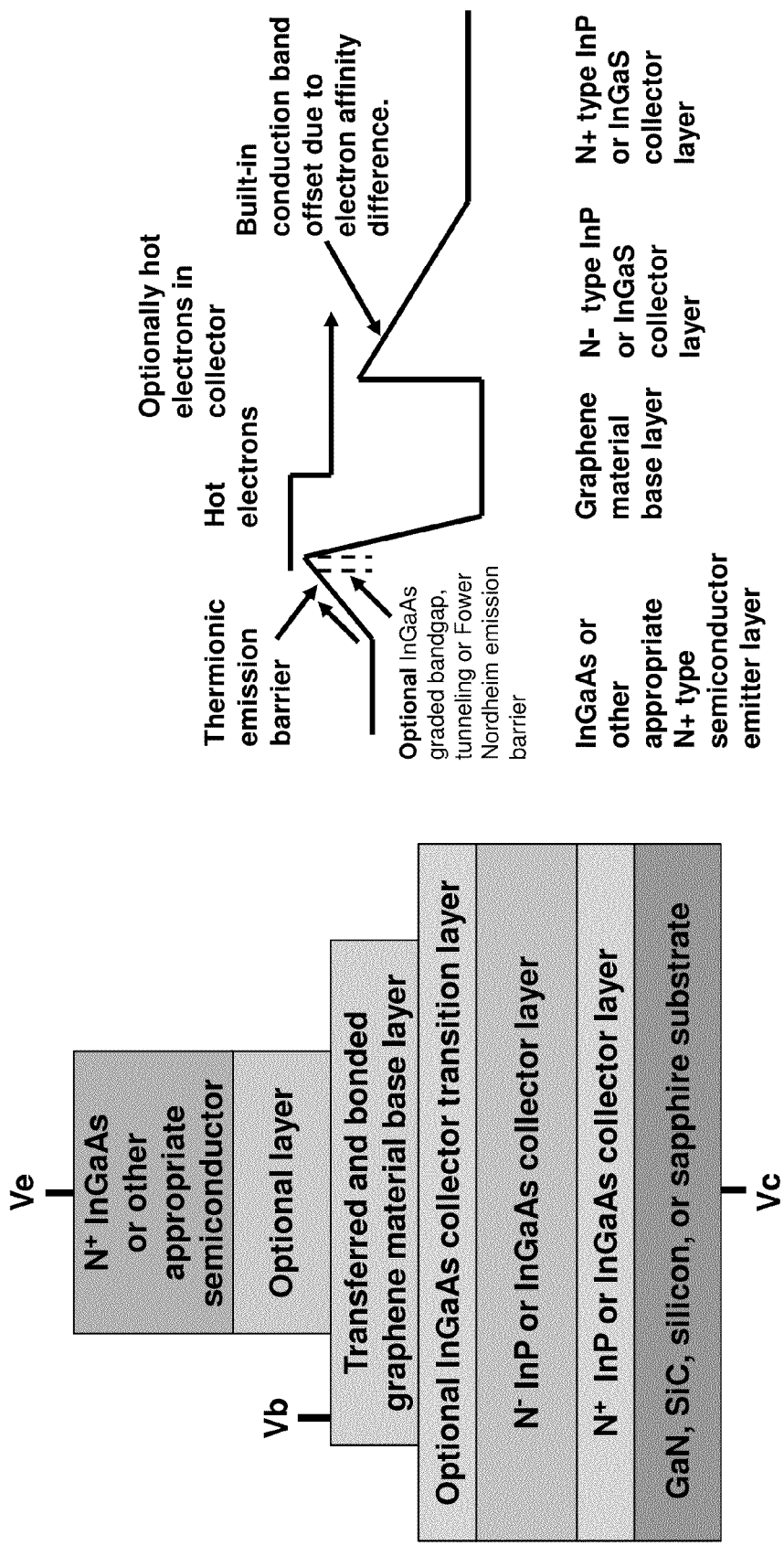
FIGS. 8A-8B depict aspects of a fourth exemplary embodiment of a hot electron transistor having a graphene base in accordance with the present invention.

FIGS. 8A-8B: N+ InGaAs Emitter.

As shown in FIG. 8A, a transistor device in accordance with this embodiment of the present invention can have an N+ InGaAs or other appropriate semiconductor emitter; an optional InGaAs graded thermionic emission barrier injection structure, tunnel barrier injection structure, Fowler Nordheim injection structure, or resonant tunneling injection structure; a transferred and bonded graphene material base layer; an optional InGaAs collector transition layer; an N− InP or InGaAs collector; and an N+ InP or InGaAs collector, all disposed on a GaN, SiC, silicon, or sapphire substrate.

As seen from the conduction band diagram in FIG. 8B, hot electrons can be injected from the N+ InGaAs or other appropriate semiconductor emitter, travel through an emission barrier formed by the optional InGaAs layer, and enter the graphene material base layer. The electrons then traverse the base layer and may enter the collectors optionally as hot electrons as described above, with the InP or InGaAs collector providing a built-in conduction band offset due to the electron affinity difference between graphene and SiC.

Figures 9A, 9B:
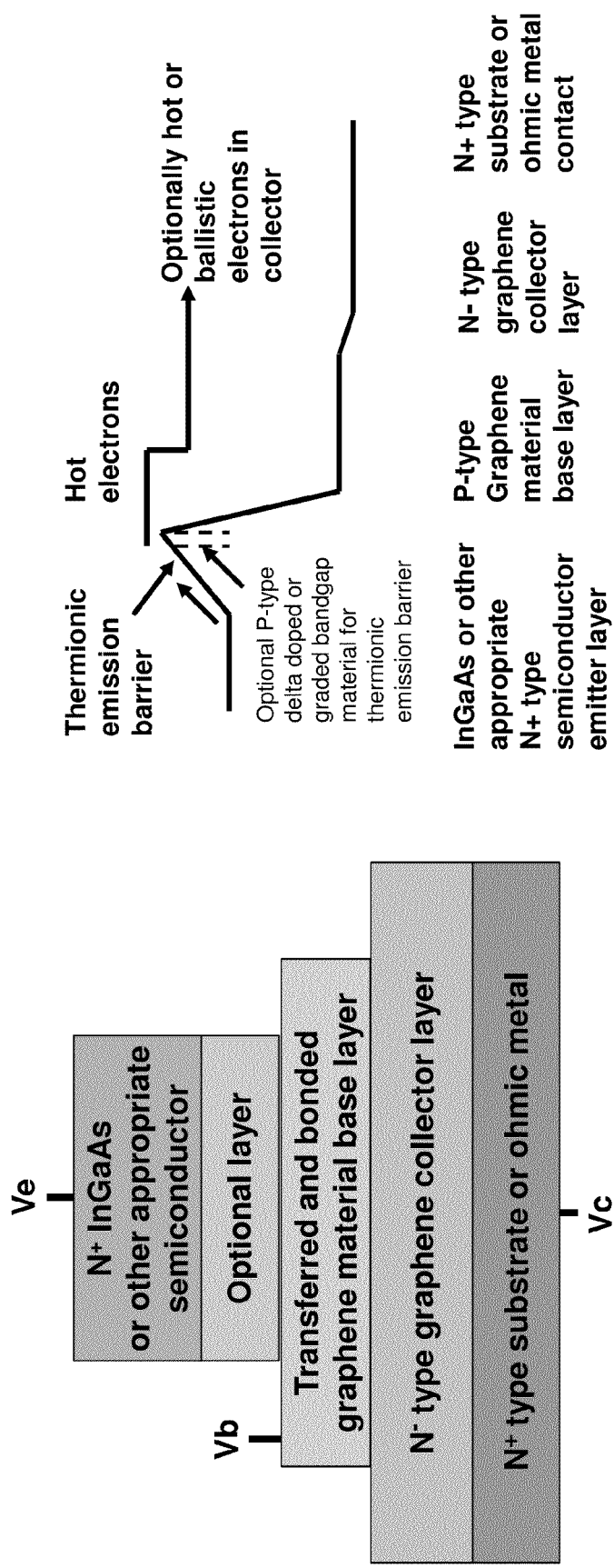
FIGS. 9A-9B depict aspects of a fifth exemplary embodiment of a hot electron transistor having a graphene base in accordance with the present invention.

FIGS. 9A-9B: N+ InGaAs Emitter with Graphene Collector.

As shown in FIG. 9A, a transistor device in accordance with this embodiment of the present invention can have an N+ InGaAs or other appropriate semiconductor emitter; an optional InGaAs graded thermionic emission barrier injection structure, tunnel barrier injection structure, Fowler Nordheim barrier injection structure, or resonant tunneling injection structure; a transferred and bonded graphene material base layer; and an N− type graphene collector, all disposed on an N+ type substrate or ohmic material.

As seen from the conduction band diagram in FIG. 9B, hot electrons can be injected from the N+ InGaAs or other appropriate semiconductor emitter, travel through an emission barrier formed by the optional InGaAs layer, and enter the graphene material base layer. The electrons then traverse the base layer and may enter optionally as hot or ballistic electrons into the N+ graphene collector.

FIGS. 10A-10B and 11A-11B depict aspects of exemplary embodiments of a graphene base transistor for non-hot electron injection in accordance with the present invention.

Figure 10B:
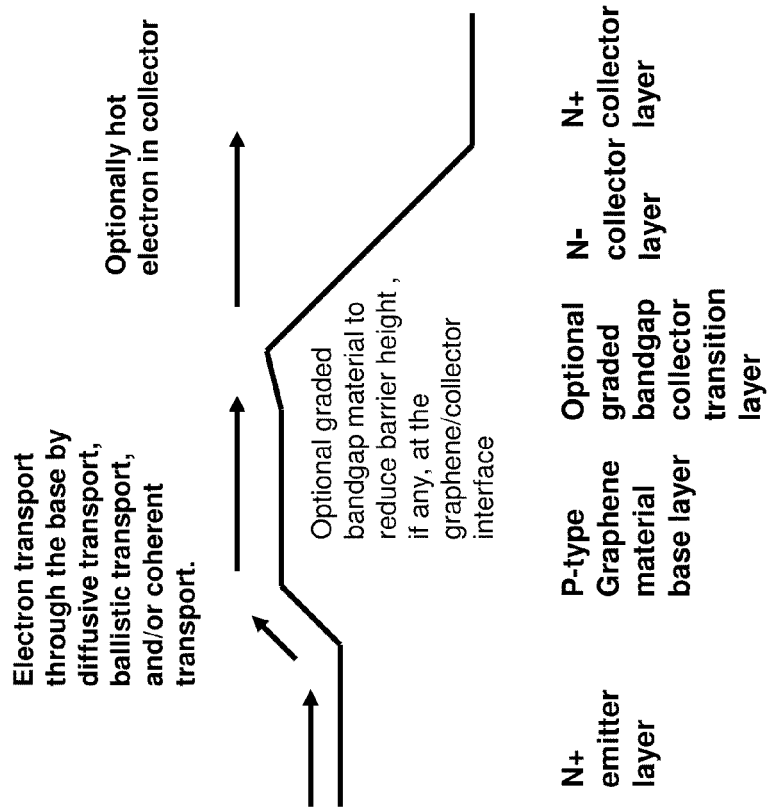
FIGS. 10A-10B depict aspects of a first exemplary embodiment of a non-hot electron transistor having a graphene base in accordance with the present invention.
Figure 10A:
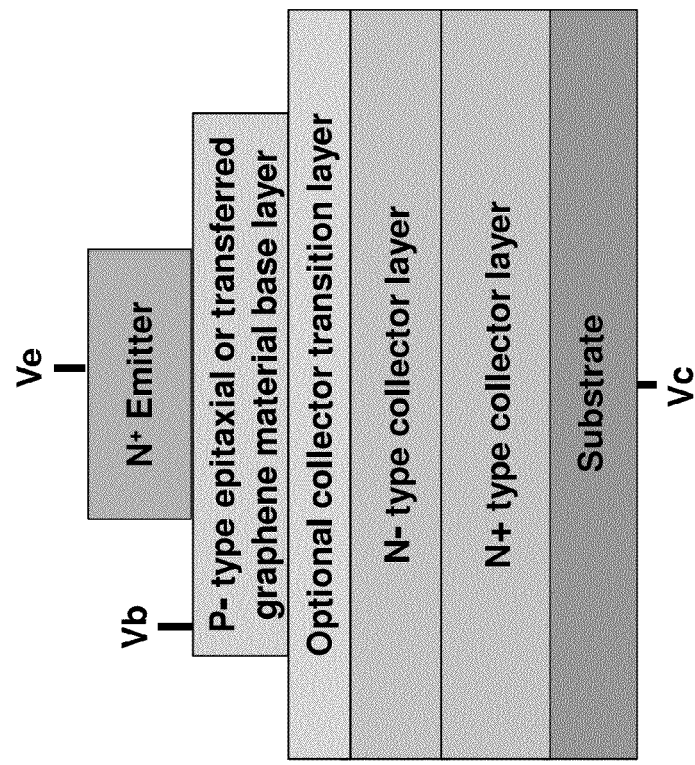

FIGS. 10A-10B: N+ InGaAs Emitter with Graphene Collector.

As shown in FIG. 10A, a transistor device in accordance with this embodiment of the present invention can have an N+ emitter comprising, for example, one of the SMNHEI materials described above; a P-type graphene material base layer that is transferred from a graphene CVD growth on a metal substrate or a graphene epitaxial growth on a SiC substrate; an optional collector transition layer made up of a graded bandgap material to reduce barrier height, if any, at the graphene/collector interface; an N-type collector formed from one or more of CdSe, InAs, SnO2:F, InSb, ZnO, BN, CdTe, CdS, In2O3:Sn, InGaN, InAsP, InP, InGaAs, InAlAs, InGaSb, graphene, and diamond material layers material layers, all disposed on a substrate that is contacted by an ohmic metal electrode connection. Alternately, a Schottky metal electrode connection an be made to the N-type collector layer.

As seen from the conduction band diagram in FIG. 10B, electrons can be injected from the N+ emitter as non-hot electrons having an energy E less than that of the conduction band minimum of the graphene material base layer. The non-hot electrons are transported through the base by diffusive transport, ballistic transport, and/or coherent transport and enter optionally as hot electrons into the collector.

Figure 11B:
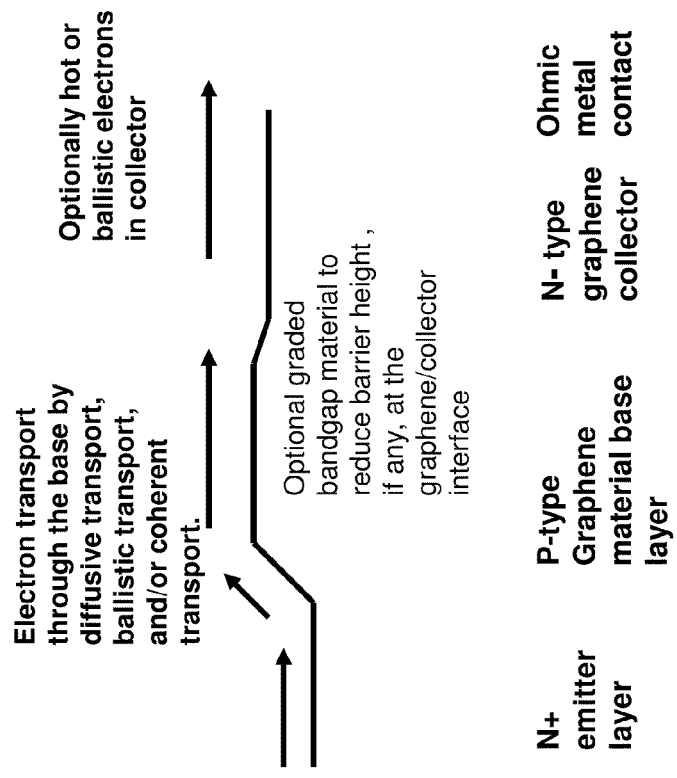
FIGS. 11A-11B depict aspects of a second exemplary embodiment of a non-hot electron transistor having a graphene base in accordance with the present invention.
Figure 11A:
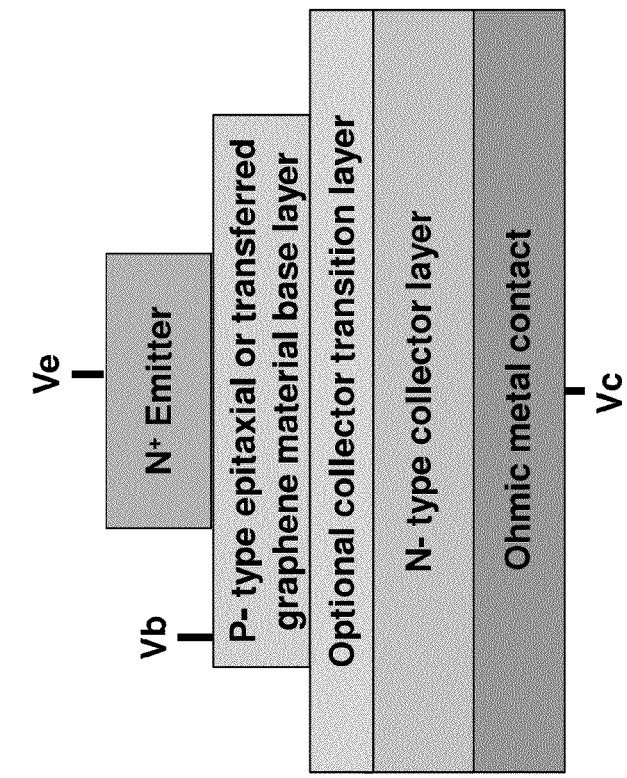

FIGS. 11A-11B: N+ InGaAs Emitter with Graphene Collector.

As shown in FIG. 11A, a transistor device in accordance with this embodiment of the present invention can have an N+ emitter comprising, for example, one of the SMNHEI materials described above; P-type graphene material base layer that is transferred from a graphene CVD growth on a metal substrate or a graphene epitaxial growth on a SiC substrate—; an optional collector transition layer made up of a graded bandgap material to reduce barrier height, if any, at the graphene/collector interface; an N-type collector formed from N-type graphene that is contacted by an ohmic metal electrode connection. Only a small reverse bias voltage can be applied between graphene base and graphene collector because of small bandgap (in the case of bi-layer graphene or doped graphene) or no bandgap (in the case of single-layer graphene) of a graphene material layer. The electrons in the collector can have ballistic transport for a short distances into the graphene collector As seen from the conduction band diagram in FIG. 11B, electrons can be injected from the N+ emitter as non-hot electrons having an energy E less than that of the conduction band minimum of the graphene material base layer. The non-hot electrons are transported through the base by diffusive transport, ballistic transport, and/or coherent transport and enter optionally as hot or ballistic electrons into the collector.

ADVANTAGES AND NEW FEATURES

One of the primary advantages of graphene is that it has extremely high electric conductivity for extremely thin graphene material base layer. One of the critical parameters for transistors is the base resistance and thus, graphene can have a low base resistance even for very thin graphene material base layers. A low base resistance is important to achieve a high maximum frequency of oscillation, fmax. The high electrical conductivity of graphene allows the use of thin graphene material base layer which reduces the transit time of electrons through the base layer and also reduces the scattering energy loss of hot electrons in transiting the thin graphene base material. Many scientists believe that graphene has the potential to have the highest conductivity of any material and can have a higher conductivity of than silver for the same thickness. Experimental results indicate that the resistivity of a single sheet of graphene approximately 3 angstrom thick grown on the silicon face of SiC has a sheet resistance on the order of 750 ohm/square to 1000 ohms/square. Experimental results also indicate that a graphene sheet grown on the surface of copper can have a sheet resistance of approximately 1200 to 1500 ohms/square. The sheet resistance of graphene material having a few sheets of graphene can be less than 100 ohms/square. The thickness of a few sheets of graphene can be less than 1 nm. In addition, the high velocity of electrons in the graphene material can lower the base transit time. Thus, the semiconductor device with graphene material base layer can have high fT and high fmax.

The use of graphene for base layer of a transistor can allow wide bandgap materials such as AlGaN, GaN, InAlN, and SiC to be used as the collector layer material of the transistors. AlGaN, GaN, InAlN and SiC have extremely high Johnson figure of merit and thus the graphene base transistor can allow high power, high frequency operation.

The use of graphene for base layer of a transistor can allow wide bandgap materials such as AlGaN, GaN, InAlN, and SiC to be used as the collector material of the transistors. Because of the wide bandgap nature of AlGaN, GaN, InAlN and GaN, the graphene base transistor can allow high temperature operation.

The enhanced lateral thermal conductivity of graphene can spread the thermal load to a larger area and thus reduce the thermal resistance.

The use of graphene for the base layer also can lower the transistor turn-on voltage thereby reducing power dissipation within the device.

Although particular embodiments, aspects, and features have been described and illustrated, one skilled in the art would readily appreciate that the invention described herein is not limited to only those embodiments, aspects, and features but also contemplates any and all modifications within the spirit and scope of the underlying invention described and claimed herein, and such combinations and embodiments are within the scope of the present disclosure.

What is claimed is:

1. A transistor device comprising:
   a graphene material base layer comprising at least one sheet of graphene and further comprising at least one sheet of graphene optimized for formation of nucleation sites for atom attachment for epitaxial material growth;
   an emitter adjacent to a first side of the graphene material base layer and forming an emitter/base interface therewith;
   a collector adjacent to a second side of graphene material base layer opposite the first side and forming a collector/base interface therewith; and
   a plurality of electrodes, each of the plurality of electrodes being connected to and forming a separate electrical connection with one of the emitter, collector, and base;
   wherein the emitter has a conduction band minimum at a higher energy than a conduction band minimum of the graphene material base layer and is configured to inject electrons into the graphene material base layer, the injected electrons having an energy E substantially greater than a Fermi energy $E_F$ of the graphene material base layer to produce hot electrons in the graphene material base layer, where E is greater than $E_F + 10 k_B T$ and where $k_B$ is a Boltzmann constant and T is an absolute temperature of a lattice associated with the graphene material base layer.

2. The transistor device according to claim 1, wherein the emitter comprises an N-type semiconductor material.

3. The transistor device according to claim 1, wherein the electrodes form ohmic electrical connection to the emitter, collector, and base.

4. The transistor device according to claim 1, wherein the electrodes connected to the emitter and to the base layer form ohmic electrical connections and the electrode connected to the collector forms a Schottky connection.

5. The transistor device according to claim 1, wherein the emitter comprises one or more of ZnO, BN, InGaN, InAsP, InP, InGaAs, InAlAs, InGaSb, Diamond, GaN, GaAs, Silicon, 4H-SiC, GaSb, Germanium, AlP, ZnS, GaP, AlSb, AlAs, InGaN, and AlN emitter material layers.

6. The transistor device according to claim 5, where at least one emitter material layer includes a plurality of sublayers each having a selected doping concentration, wherein a first one of the plurality of sublayers is in contact with the electrode and has an N-type dopant concentration sufficient to make ohmic contact to the electrode, and wherein a second one of the plurality of sublayers has an N-type dopant concentration sufficient to provide a high density of carriers for injection into the graphene base layer.

7. The transistor device according to claim 5, where in the emitter material layer is a single-crystal, polycrystalline, highly oriented, nanocrystalline, amorphous material layer.

8. The transistor device according to claim 5, wherein one or more of the emitter material layer is P-type doped, has a P-type delta layer, or has graded P-type doping to implement a thermionic emission injection structure.

9. The transistor device according to claim 5, where in the emitter material layer is grown selectively.

10. The transistor device according to claim 1, wherein the base comprises a quantum well having energy levels and the carriers transport through the base layer by resonant tunneling.

11. The transistor device according to claim 1, wherein the emitter comprises a metal material, the device further including an emitter transition layer configured to provide an insulating tunnel injection structure disposed at the emitter interface with the graphene material base layer (emitter/base interface).

12. The transistor device according to claim 1, wherein the collector comprises an N-type semiconductor material.

13. The transistor device according to claim 1, wherein the collector comprises one or more of ZnO, BN, InGaN, InAsP, InP, InGaAs, InAlAs, InGaSb, Diamond, GaN, GaAs, Silicon, 4H-SiC, GaSb, Germanium, Graphene, AlP, ZnS, GaP, AlSb, AlAs, InGaN, and AlN material layers.

14. The transistor device according to claim 1, wherein the collector is deposited on a substrate.

15. The transistor device according to claim 1, wherein the graphene material base layer comprises N-type graphene.

16. The transistor device according to claim 1, wherein the graphene material base layer comprises P-type graphene.

17. The transistor device according to claim 1, wherein the graphene material base layer comprises a layered structure of a plurality of graphene sheets, a graphene sheet adjacent to the emitter being configured to facilitate the growth of emitter material on the graphene material base layer first side.

18. The transistor device according to claim 1, wherein the graphene material base layer comprises a layered structure of a plurality of graphene sheets, a graphene sheet adjacent to the emitter being configured to improve interaction of the graphene material with a material forming the emitter.

19. The transistor device according to claim 1, wherein the graphene material base layer comprises a layered structure of a plurality of graphene sheets, a graphene sheet adjacent to the emitter being configured to improve growth of emitter material on the graphene material base layer.

20. The transistor device according to claim 1, wherein the graphene material base layer comprises a layered structure of a plurality of graphene sheets, a graphene sheet adjacent to the collector being configured to improve interaction of the graphene material with a material forming the collector.

21. The transistor device according to claim 1, further comprising an emitter transition layer within the emitter disposed at the emitter interface with the graphene material base layer (emitter/base interface) and forming an interface with each of the emitter and the graphene material base layer;
wherein the emitter transition layer is configured to provide one of a thermionic emission injection structure, a planar doped barrier thermionic emission injection structure, a camel thermionic emission injection structure, a graded bandgap thermionic emission structure, a N-type/i-layer/P-type/i-layer (NIPI) doping superlattice injection structure, a superlattice injection structure, a tunneling injection structure, a metal-oxide tunnel injection structure, a Fowler Nordheim injection structure, a resonant tunneling injection structure, between the emitter and the graphene material base layer.

22. The transistor device according to claim 1, further comprising a collector transition layer disposed at the collector interface with the graphene material base layer (collector/base interface) and forming an interface with each of the graphene material base layer and the collector;
wherein the collector transition layer is configured to smooth a conduction band potential barrier between the graphene material base layer and the collector and to facilitate the transport of electrons into the collector.

23. The transistor device according to claim 1 wherein the graphene material base forms a quantum well base having discrete allowed energy levels for the transit of electrons at the discrete allowed energy levels from the emitter to the collector.

24. The transistor according to claim 1 wherein current transits the graphene material base layer as ballistic electrons.

25. The transistor according to claim 1 where in the graphene material base layer has one of a graphene nanoribbon design having multiple graphene nanoribbons, an antidot design, a bi-layer material layer, and selected doping to introduce a bandgap into the graphene base material layer.

26. A transistor device comprising:
a graphene material base layer comprising at least one sheet of graphene and further comprising at least one sheet of graphene optimized for formation of nucleation sites for atom attachment for epitaxial material growth;
a emitter adjacent to a first side of the graphene material base layer and forming an emitter/base interface therewith, the emitter having a conduction band minimum lower than a conduction band minimum of the graphene material base layer and being configured to inject electrons having an energy E less than a Fermi energy E.sub.F of the graphene material base layer to produce non-hot electrons in the graphene material base layer;
a collector adjacent to a second side of graphene material base layer opposite the first side and forming a collector/base interface therewith, the electron collector having a conduction band minimum lower than the conduction band minimum of the graphene material base layer and being configured to receive electrons from the graphene material base layer; and
a plurality of electrodes, each of the plurality of electrodes being connected to and forming a separate electrical connection with one of the emitter, collector, and base.

27. The transistor device according to claim 26, wherein the emitter comprises an N-type semiconductor material.

28. The transistor device according to claim 26, wherein the emitter comprises one of CdSe, InAs, SnO2:F, InSb, ZnO, BN, CdTe, CdS, In2O3:Sn, InGaN, InAsP, InP, InGaAs, InAlAs, InGaSb, and diamond emitter material layers.

29. The transistor device according to claim 26, wherein the collector comprises an N-type semiconductor material.

30. The transistor device according to claim 26, wherein the collector comprises one of CdSe, InAs, SnO2:F, InSb, ZnO, BN, CdTe, CdS, In2O3:Sn, InGaN, InAsP, InP, InGaAs, InAlAs, InGaSb, graphene, and diamond material layers.

31. The transistor device according to claim 26, wherein the graphene material base layer comprises P-type graphene.

32. The transistor device according to claim 26, wherein the graphene material base layer comprises a layered structure of a plurality of graphene sheets, a graphene sheet adjacent to the emitter being configured to facilitate the growth of emitter material on the graphene material base layer first side.

33. The transistor device according to claim 26, wherein the graphene material base layer comprises a layered structure of a plurality of graphene sheets, a graphene sheet adjacent to the emitter being configured to improve the interaction of the graphene material with a material forming the emitter.

34. The transistor device according to claim 26, wherein the graphene material base layer comprises a layered structure of a plurality of graphene sheets, a graphene sheet adjacent to the collector being configured to improve interaction of the graphene material with a material forming the collector.

35. The transistor according to claim 26 where in the graphene material base layer has one of a graphene nanoribbon design having multiple graphene nanoribbons, an antidot design, a bi-layer material layer, and surface doping to introduce a bandgap into the graphene base material layer.

36. The transistor device according to claim 26, further comprising a collector transition layer disposed at the collector interface with the graphene material base layer (collector/ base interface and forming an interface with each of the graphene material base layer and the collector, wherein the collector transition layer is configured to smooth a bandgap between the graphene material base layer and the collector and to facilitate the collection of electrons into the collector.

37. The transistor device according to claim 26, wherein the emitter comprises a semimetal material.

38. The transistor device according to claim 26, further comprising an emitter transition layer within the emitter disposed at the emitter interface with the graphene material base layer (emitter/base interface) and forming an interface with each of the emitter and the graphene material base layer;

wherein the emitter transition layer is configured to provide one of a thermionic emission injection structure, a planar doped barrier thermionic emission injection structure, a camel thermionic emission injection structure, a graded bandgap thermionic emission structure, a N-type/i-layer/P-type/i-layer (NIPI) doping superlattice injection structure, a superlattice injection structure, a tunneling injection structure, a metal-oxide tunnel injection structure, a Fowler Nordheim injection structure, a resonant tunneling injection structure, between the emitter and the graphene material base layer.

* * * * *